(12) United States Patent
Nishimura et al.

(10) Patent No.: US 8,808,974 B2
(45) Date of Patent: *Aug. 19, 2014

(54) METHOD FOR FORMING PATTERN

(71) Applicant: JSR Corporation, Tokyo (JP)

(72) Inventors: Yukio Nishimura, Tokyo (JP); Kaori Sakai, Tokyo (JP); Nobuji Matsumura, Tokyo (JP); Makoto Sugiura, Tokyo (JP); Atsushi Nakamura, Tokyo (JP); Gouji Wakamatsu, Tokyo (JP); Yuusuke Anno, Tokyo (JP)

(73) Assignee: JSR Corporation, Tokyo (JP)

( * ) Notice: Subject to any disclaimer, the term of this patent is extended or adjusted under 35 U.S.C. 154(b) by 116 days.

This patent is subject to a terminal disclaimer.

(21) Appl. No.: 13/769,907

(22) Filed: Feb. 19, 2013

(65) Prior Publication Data

US 2013/0164695 A1    Jun. 27, 2013

Related U.S. Application Data

(62) Division of application No. 12/529,341, filed as application No. PCT/JP2008/054881 on Mar. 17, 2008, now abandoned.

(30) Foreign Application Priority Data

Mar. 28, 2007   (JP) .................................. 2007-084586
Feb. 12, 2008   (JP) .................................. 2008-030850

(51) Int. Cl.
| | | |
|---|---|---|
| G03F 7/20 | (2006.01) | |
| G03F 7/40 | (2006.01) | |
| G03F 7/00 | (2006.01) | |
| G03F 7/039 | (2006.01) | |

(52) U.S. Cl.
CPC ................ G03F 7/0035 (2013.01); G03F 7/40 (2013.01); G03F 7/0397 (2013.01); G03F 7/2024 (2013.01); G03F 7/2041 (2013.01)
USPC ........................................................ 430/325

(58) Field of Classification Search
USPC ............................................ 430/322, 325, 330
See application file for complete search history.

(56) References Cited

U.S. PATENT DOCUMENTS

| | | | |
|---|---|---|---|
| 4,026,857 A | 5/1977 | Brown et al. | |
| 5,214,106 A | 5/1993 | Carlson et al. | |

(Continued)

FOREIGN PATENT DOCUMENTS

| | | |
|---|---|---|
| JP | 58-190946 | 11/1983 |
| JP | 05-136033 | 6/1993 |

(Continued)

OTHER PUBLICATIONS

Japanese Office Action for corresponding JP Application No. 2009-506291, Aug. 23, 2011.

(Continued)

*Primary Examiner* — Brittany Raymond
(74) *Attorney, Agent, or Firm* — Ditthavong & Steiner, P.C.

(57) ABSTRACT

A method for forming a pattern includes providing a first positive-working radiation-sensitive resin composition on a substrate to form a first resist layer. The first positive-working radiation-sensitive resin composition includes a crosslinking agent, a polymer containing an acid-unstable group and not containing a crosslinking group, a radiation-sensitive acid generator, and a solvent. The first resist layer is exposed selectively to radiation, and developed to form a first resist pattern. The first resist pattern is made inactive to radiation, or insolubilized in an alkaline developer or in a second positive-working radiation-sensitive resin composition. The second positive-working radiation-sensitive resin composition is provided on the substrate to form a second resist layer. The second resist layer is exposed selectively to radiation, and developed to form a second resist pattern in the space area of the first resist pattern.

4 Claims, 4 Drawing Sheets

(56) References Cited

U.S. PATENT DOCUMENTS

| | | | |
|---|---|---|---|
| 6,010,826 A | 1/2000 | Abe et al. | |
| 2002/0048723 A1 | 4/2002 | Lee et al. | |
| 2003/0082926 A1 | 5/2003 | Endo et al. | |
| 2003/0087180 A1 | 5/2003 | Kudo et al. | |
| 2004/0197707 A1 | 10/2004 | Yamanaka et al. | |
| 2005/0026079 A1 | 2/2005 | Kihara et al. | |
| 2006/0127816 A1* | 6/2006 | Kang et al. | 430/312 |
| 2006/0160022 A1* | 7/2006 | Xu et al. | 430/270.1 |
| 2006/0166133 A1 | 7/2006 | Koitabashi et al. | |

FOREIGN PATENT DOCUMENTS

| | | |
|---|---|---|
| JP | 08-194308 | 7/1996 |
| JP | 2001-27806 | 1/2001 |
| JP | 2001-305735 | 11/2001 |
| JP | 2003-222999 | 8/2003 |
| JP | 2004-004669 | 1/2004 |
| JP | 2004-161838 | 6/2004 |
| JP | 2004-264623 | 9/2004 |
| JP | 2006-3846 | 1/2006 |
| JP | 2007-65503 | 3/2007 |
| WO | WO 98/58980 | 12/1998 |

OTHER PUBLICATIONS

Extended European Search Report for corresponding EP Application No. 08722276.6-2222, Dec. 8, 2010.

Lee et al., Double exposure technology using silicon containing materials Advances in Resist Technology and Processing XXIII, edited by Qinghuang Lin Proc. of SPIE vol. 6153, 61531K, (2006).

V. Wiaux et al., 3rd International Symposium on Immersion Lithography Kyoto, Oct. 2-5, 2006.

* cited by examiner

METHOD FOR FORMING PATTERN

CROSS-REFERENCE TO RELATED APPLICATIONS

The present application is a divisional application of the U.S. patent application Ser. No. 12/529,341 filed Aug. 31, 2009, which in turn is a national stage application of International Application No. PCT/JP2008/054881, filed Mar. 17, 2008, which claims priority to Japanese Patent Application No. 2007-084586, filed on Mar. 28, 2007 and to Japanese Patent Application No. 2008-030850, filed on Feb. 12, 2008. The contents of these applications are incorporated herein by reference in their entirety.

BACKGROUND OF THE INVENTION

1. Field of the Invention

The present invention relates to a method for forming pattern.

2. Discussion of the Background

In the field of microfabrication represented by the manufacture of integrated circuit devices, lithographic technology enabling microfabrication with a line width of 0.10 μm or less has been demanded in recent years in order to increase the degree of integration. However, microfabrication in a subquarter micron level is said to be very difficult using near ultraviolet rays such as i-lines which are generally used as radiation in a common lithography process. Therefore, in order to perform microfabrication with a line width of 0.10 μm or less, use of radiation with a shorter wavelength has been studied. As examples of such short wavelength radiation, a bright line spectrum of a mercury lamp, deep ultraviolet rays represented by excimer lasers, X rays, electron beams, and the like can be given. A KrF excimer laser (wavelength: 248 nm) or an ArF excimer laser (wavelength: 193 nm) are being given particular attention.

As a resist suitable for being irradiated with such an excimer laser, many chemically amplified resists utilizing the chemical amplification effect of a component having an acid-dissociable functional group and a component (hereinafter referred to as "an acid generator") which generates an acid upon irradiation (hereinafter referred to as "exposure") have been proposed. As a chemically amplified resist, a resist containing a resin having a t-butyl ester group of carboxylic acid or a t-butyl carbonate group of phenol and an acid generator has been proposed. The t-butyl ester group or t-butyl carbonate group in the resin dissociates by the action of an acid generated upon exposure, whereby the resist is provided with an acidic group such as a carboxylic group or a phenolic hydroxyl group. As a result, the exposed areas of the resist film become readily soluble in an alkaline developer.

Capability of forming more minute patterns (a minute resist pattern with a line width of about 45 nm, for example) will be required for the lithographic process in the future. Reducing the wavelength of a light source of a photolithography instrument and increasing the numerical aperture (NA) of a lens could be a means for forming such a pattern with a line width of less than 45 nm. However, an expensive exposure machine is necessary for reducing the wavelength of a light source. In addition, due to a trade-off relationship between the resolution and the depth of focus, increasing the numerical aperture (NA) of a lens involves a problem of decreasing the depth of focus even if the resolution is increased.

Recently, a liquid immersion lithographic method has been reported as a lithographic technique enabling solution of such a problem. In the process, a layer of a liquid high refractive index medium (liquid for liquid immersion lithography) such as pure water or a fluorine-containing inert liquid is caused to be present during exposure between the lens and the resist film on a substrate, at least on the surface of the resist film. According to this method, an inert gas atmosphere in the light-path space, such as air and nitrogen, is replaced by a liquid with a high refractive index (n), for example, pure water, whereby resolution can be increased without a decrease in the focal depth by using a light source with a given wavelength to the same degree as in the case in which a light source with a shorter wavelength is used or the case in which a higher NA lens is used. Since a resist pattern with a higher resolution excelling in focal depth can be formed at a low cost using a lens mounted in existing apparatuses by using the liquid immersion lithographic method, the method has received a great deal of attention and is currently being put into practice.

Although downsizing of the line width of the above exposure technology is said to be up to 45 nmhp at most, the technological development is advancing toward a 32 nmhp generation requiring further minute fabrication. More recently, in an effort to respond to such device complication and high density requirement a double patterning or double exposure technology of patterning 32 nm LS by producing a rough line pattern or an isolated trench pattern and superposing these patterns displacing one pattern from the other by half a pitch has been proposed in SPIE 2006 61531K and Third International Symposium Immersion Lithography PO-11.

In one proposed example, after forming a 1:3 pitch 32 nm line and after processing a hard mask made from a material such as $SiO_2$ by etching, another 1:3 pitch 32 nm line is formed in a position displaced from the first position by half a pitch, followed by HM processing again by etching. As a result, a 1:1 pitch 32 nm line can be ultimately formed (See Third International Symposium Immersion Lithography PO-11).

SUMMARY OF THE INVENTION

According to one aspect of the present invention, a method for forming a pattern includes providing a first positive-working radiation-sensitive resin composition on a substrate to form a first resist layer. The first positive-working radiation-sensitive resin composition includes a crosslinking agent, a polymer containing an acid-unstable group and not containing a crosslinking group, a radiation-sensitive acid generator, and a solvent. The first resist layer is exposed selectively to radiation through a first mask. The exposed first resist layer is developed to form a first resist pattern. The first resist pattern is made inactive to radiation, or insolubilized in an alkaline developer or in a second positive-working radiation-sensitive resin composition. The second positive-working radiation-sensitive resin composition is provided on the substrate on which the first resist pattern has been formed to form a second resist layer. The second resist layer is exposed selectively in a space area of the first resist pattern to radiation through a second mask. The exposed second resist layer is developed to form a second resist pattern in the space area of the first resist pattern.

According to another aspect of the present invention, a method for forming a pattern includes providing a first positive-working radiation-sensitive resin composition on a substrate to form a first resist layer. The first positive-working radiation-sensitive resin composition includes a polymer containing a crosslinking group and an acid-unstable group, a radiation-sensitive acid generator, and a solvent. The first resist layer is exposed selectively to radiation through a first mask. The exposed first resist layer is developed to form a first resist pattern. The first resist pattern is made inactive to radiation, or insolubilized in an alkaline developer or in a second positive-working radiation-sensitive resin composition. The second positive-working radiation-sensitive resin composition is provided on the substrate on which the first resist pattern has been formed to form a second resist layer. The second resist layer is exposed selectively in a space area of the first resist pattern to radiation through a second mask. The exposed second resist layer is developed to form a second resist pattern in the space area of the first resist pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
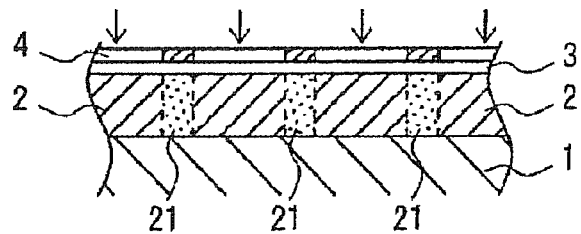
FIGS. 1A to 1E are schematic views for illustrating the steps of forming a resist pattern.

Embodiments of the present invention are as follows.

[1] A positive-working radiation-sensitive resin composition including (A) a crosslinking agent, (B1) a polymer containing an acid-unstable group (not containing a crosslinking group), (C) a radiation-sensitive acid generator, and (D) a solvent, the positive-working radiation-sensitive resin composition being used for forming a first resist layer used in a method of forming a resist pattern which includes (1) a step of forming a first resist pattern by forming a first resist layer on a substrate using the positive-working radiation-sensitive resin composition for forming the first resist layer, selectively exposing the first resist layer to radiation through a mask, and developing the exposed first resist layer, (2) a step of making the first resist pattern inactive to radiation or insolubilizing the first resist pattern in an alkaline developer or a positive-working radiation-sensitive resin composition for forming a second resist layer, (3) a step of forming a second resist layer on the substrate on which the first resist pattern has been formed using the positive-working radiation-sensitive resin composition for forming the second resist layer, and selectively exposing the second resist layer to radiation through a mask in the space area of the first resist pattern, and (4) a step of forming a second resist pattern in the space area of the first resist pattern by developing the exposed second resist layer.

[2] The positive-working radiation-sensitive resin composition according to [1], wherein the crosslinking agent (A) is a compound having two or more groups shown by the following formula (1),

wherein $R^1$ and $R^2$ represent a hydrogen atom or a group shown by the following formula (2), at least one of $R^1$ and $R^2$ being a group shown by the following formula (2),

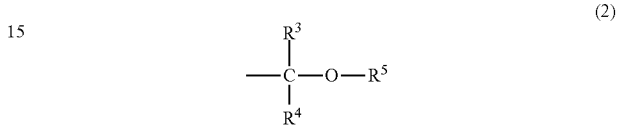

wherein $R^3$ and $R^4$ represent a hydrogen atom, an alkyl group having 1 to 6 carbon atoms, or an alkoxyalkyl group having 1 to 6 carbon atoms, or $R^3$ and $R^4$ bond together to form a ring having 2 to 10 carbon atoms, and $R^5$ represents a hydrogen atom or an alkyl group having 1 to 6 carbon atoms, a compound having two or more epoxy groups or oxetane groups, or a compound having two or more vinyl groups and a skeleton shown by any one of the following formulas (12-1) to (12-4),

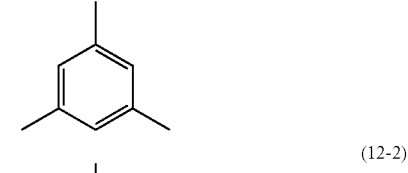

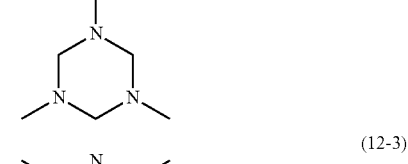

[3] The positive-working radiation-sensitive resin composition according to [1] or [2], wherein the amount of the crosslinking agent (A) is 1 to 30 mass % of the solid component of the composition.

[4] The positive-working radiation-sensitive resin composition according to any one of [1] to [3], wherein the polymer (B1) has a repeating unit which contains an acid-unstable group shown by the following formula (3),

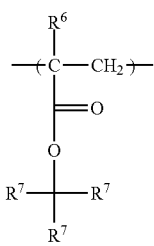

(3)

wherein $R^6$ represents a hydrogen atom, a methyl group, or a trifluoromethyl group, $R^7$ individually represents a monovalent alicyclic hydrocarbon group having 4 to 20 carbon atoms, a derivative thereof, or a linear or branched alkyl group having 1 to 4 carbon atoms, and a repeating unit which contains a lactone structure shown by at least one of the following formulas (4-1) to (4-6),

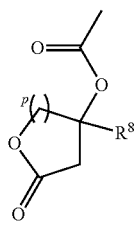

(4-1)

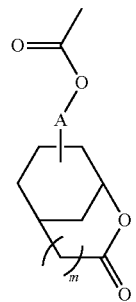

(4-2)

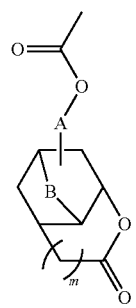

(4-3)

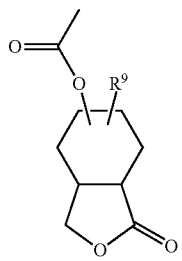

(4-4)

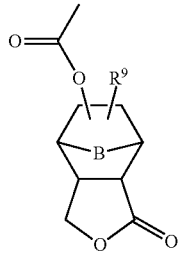

(4-5)

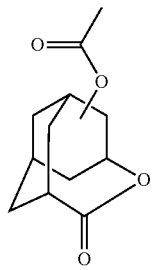

(4-6)

wherein $R^8$ represents a hydrogen atom or a substituted or unsubstituted alkyl group having 1 to 4 carbon atoms, $R^9$ represents a hydrogen atom or a methoxy group, A represents a single bond or a methylene group, B represents an oxygen atom or a methylene group, p is an integer of 1 to 3, and m is 0 or 1.

[5] A positive-working radiation-sensitive resin composition including (B2) a polymer containing a crosslinking group and an acid-unstable group, (C) a radiation-sensitive acid generator, and (D) a solvent, the positive-working radiation-sensitive resin composition being used for forming a first resist layer used in a method of forming a resist pattern which includes (1) a step of forming a first resist pattern by forming a first resist layer on a substrate using the positive-working radiation-sensitive resin composition for forming the first resist layer, selectively exposing the first resist layer to radiation through a mask, and developing the exposed first resist layer, (2) a step of making the first resist pattern inactive to radiation or insolubilizing the first resist pattern in an alkaline developer or a positive-working radiation-sensitive resin composition for forming a second resist layer (3) a step of forming a second resist layer on the substrate on which the first resist pattern has been formed using the positive-working radiation-sensitive resin composition for forming the second resist layer and selectively exposing the second resist layer to radiation through a mask in the space area of the first resist pattern, and (4) a step of forming a second resist pattern in the space area of the first resist pattern by developing the exposed second resist layer.

[6] The positive-working radiation-sensitive resin composition according to [5], wherein the polymer (B2) has a repeating unit which contains an acid-unstable group shown by the following formula (3), (3)

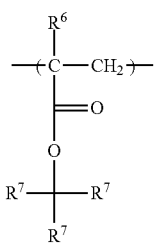

wherein R⁶ represents a hydrogen atom, a methyl group, or a trifluoromethyl group, R⁷ individually represents a monovalent alicyclic hydrocarbon group having 4 to 20 carbon atoms, a derivative thereof, or a linear or branched alkyl group having 1 to 4 carbon atoms, and a repeating unit which contains a lactone structure shown by at least one of the following formulas (4-1) to (4-6), (4-1)

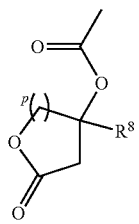

(4-2)

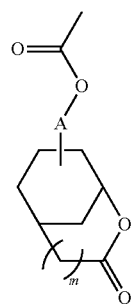

(4-3)

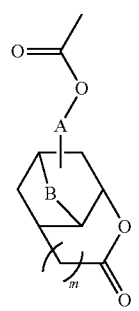

(4-4)

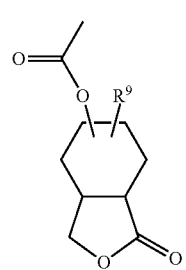

(4-5)

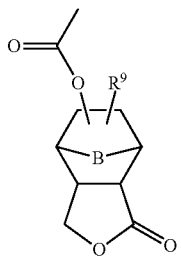

(4-6)

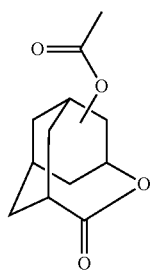

wherein $R^8$ represents a hydrogen atom or a substituted or unsubstituted alkyl group having 1 to 4 carbon atoms, $R^9$ represents a hydrogen atom or a methoxy group, A represents a single bond or a methylene group, B represents an oxygen atom or a methylene group, p is an integer of 1 to 3, and m is 0 or 1.

[7] The positive-working radiation-sensitive resin composition according [5] or [6], wherein the polymer (B2) contains at least one repeating unit shown by the following formulas (5-1) or (5-2), (5-1)

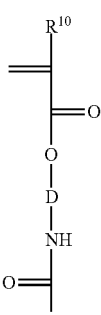

(5-2)

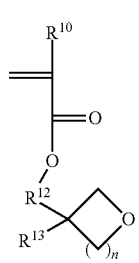

wherein, $R^{10}$ represents a hydrogen atom, a methyl group, or a trifluoromethyl group, D represents a methylene group, an ethylene group, or a propylene group; and $R^{11}$ is a group shown by the following formula (5-1-A) or the following formula (5-1-B)

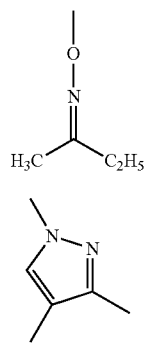

wherein, $R^{10}$ represents a hydrogen atom, a methyl group, or a trifluoromethyl group, $R^{12}$ represents a methylene group or an alkylene group having 2 to 6 carbon atoms, $R^{13}$ represents a hydrogen atom, a methyl group, or an ethyl group, and n is 0 or 1.

[8] The positive-working radiation-sensitive resin composition according to [7], containing the repeating unit shown by the above formulas (5-1) or (5-2) in an amount of 1 to 30 mol % of 100 mol % of the total polymer component in the positive-working radiation-sensitive resin composition.

[9] A method for forming a pattern including (1) a step of forming a first resist pattern by forming a first resist layer on a substrate using a positive-working radiation-sensitive resin composition for forming the first resist layer, selectively exposing the first resist layer to radiation through a mask, and developing the exposed first resist layer, (2) a step of making the first resist pattern inactive to radiation or insolubilizing the first resist pattern in an alkaline developer or a positive-working radiation-sensitive resin composition for forming a second resist layer (3) a step of forming a second resist layer on the substrate on which the first resist pattern has been formed using the positive-working radiation-sensitive resin composition for forming the second resist layer and selectively exposing the second resist layer to radiation through a mask in the space area of the first resist pattern, and (4) a step of forming a second resist pattern in the space area of the first resist pattern by developing the exposed second resist layer, the positive-working radiation-sensitive resin composition for forming the first resist layer being the composition according to any one of [1] to [8].

[10] The method for forming a pattern according to [9], wherein the step of making the first resist pattern inactive to radiation includes making inactive to heating at a 140° C. or higher temperature or to radiation at a wavelength of not more than 300 nm.

According to the resist pattern forming method of the embodiment of the present invention, in a double exposure patterning in a liquid immersion lithographic process using a radiation-sensitive resin composition containing a crosslinking agent and the first layer resist pattern is made inactive to radiation, the second layer pattern can be formed while maintaining the first layer pattern as is without making it soluble in alkali when the second layer is exposed to radiation for patterning. Therefore, the composition can be suitably used for manufacturing semiconductor devices, which are expected to become more and more micronized.

The embodiment of the present invention will now be described in detail.

[1] Method of Forming Resist Pattern

The resist pattern forming method of the embodiment of the present invention includes the following steps (1) to (4):

Step (1): a step of forming a first resist layer on a substrate using a positive-working radiation-sensitive resin composition for forming the first resist layer (hereinafter referred to from time to time as "first resist layer-forming resin composition"), exposing a prescribed area of the first resist layer to radiation, and developing the exposed resist layer to form a first resist pattern.

Step (2): a step of making the first resist pattern inactive to radiation.

Step (3): a step of forming a second resist layer on a substrate on which the first resin pattern has been formed using a positive-working radiation-sensitive resin composition for forming the second resist layer (hereinafter referred to from time to time as "second resist layer-forming resin composition") and exposing a prescribed area of the second resist layer to radiation.

Step (4): a step of developing the second resist layer to form a second resist pattern in the space area of the first resist pattern.

The first resist layer forming resin composition and the second resist layer forming resin composition used in the pattern forming method of the embodiment of the present invention are both of the type in which an acid-dissociable group in the resin dissociates by the action of an acid which is generated from the acid generating component upon exposure to radiation to form a carboxylic group and, as a result, solubility of the exposed part of the resist in an alkaline developer increases, whereby the exposed part is dissolved in an alkaline developer and removed to provide a positive-working resist pattern. The details of the components and the like contained in the resin composition will be described later.

In the step (1), the first resist layer is formed by applying the first resist layer forming resin composition to a substrate such as a silicon wafer, a wafer coated with aluminum, or the like using an appropriate application method such as rotational coating, cast coating, and roll coating. Although not particularly limited, the thickness of the first resist layer is usually 10 to 1000 nm, and preferably 10 to 500 nm.

After applying the first resist layer forming resin composition, the coating may be optionally prebaked (PB) to vaporize the solvent. The heating temperature for the PB is usually about 30 to 200° C., and preferably about 50 to 150° C., although the heating conditions are changed according to the composition of the resin composition.

In the step (1), a selected area on the first resist layer thus formed is exposed to radiation through a mask with a predetermined pattern, optionally, via a liquid for liquid immersion lithography such as water or a fluorine-containing inert liquid, and exposed to radiation to form a pattern latent image part (part made insoluble in alkali by exposure) on the first resist layer.

As radiation used for exposure, visible rays, ultraviolet rays, deep ultraviolet rays, X-rays, charged particle beams, or the like are appropriately selected depending on the types of the acid generator contained in the resin composition. It is preferable to use a deep ultraviolet ray represented by an ArF excimer laser (wavelength: 193 nm) or a KrF excimer laser (wavelength: 248 nm). An ArF excimer laser (wavelength: 193 nm) is particularly preferable.

The exposure conditions such as a radiation dose are appropriately determined depending on the composition, the type of additives, and the like of the first resist layer forming resin composition.

In the embodiment of the present invention, it is preferable to perform post-exposure bake (PEB) after the exposure. The PEB ensures a smooth dissociation reaction of the acid-dissociable group contained in the resin components. The heating temperature for the PEB is usually 30 to 200° C., and preferably 50 to 170° C., although the heating conditions are changed according to the composition of the resin composition.

In the step (1), the exposed first resist layer is developed to cause the pattern latent image part to be exposed, thereby forming a positive-working first resist pattern.

As examples of the developer used for development, alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene are preferable.

The concentration of the alkaline aqueous solution is usually 10 mass % or less. If the concentration of the alkaline aqueous solution exceeds 10 mass %, an unexposed part may be dissolved in the developer.

Organic solvents may be added to the developer containing an alkaline aqueous solution. As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given. These organic solvents may be used either individually or in combination of two or more.

The amount of the organic solvent to be used is preferably 100 vol % or less of the alkaline aqueous solution. An amount of the organic solvent exceeding 100 vol % may decrease developability, giving rise to a larger undeveloped portion in the exposed area. In addition, an appropriate amount of a surfactant and the like may be added to the developer containing the alkaline aqueous solution.

After development using the alkaline aqueous solution developer, the resist film is generally washed with water and dried.

In order to bring out the potential of the resin composition to the maximum extent, an organic or inorganic antireflection film may be formed on the substrate as disclosed in JP-B-6-12452 (JP-A-59-93448), for example. A protective film may be provided on the photoresist film in order to prevent an adverse effect of basic impurities and the like that are present in the environmental atmosphere using a method described in, for example, JP-A-5-188598. Moreover, in order to prevent the acid generator and the like from flowing out of the photoresist film, a protective film for liquid immersion lithography may be provided on the photoresist film as disclosed in, for example, JP-A-2005-352384. These techniques may be used in combination.

In the step (2) an inactivating treatment which makes the first resist pattern inactive to radiation is carried out. The term "inactive to radiation" used in the embodiment of the present invention refers to the properties of the resin components not being sensitized by exposure to radiation. That is, the inactivated pattern does not become soluble in alkali even if exposed to radiation.

As examples of the inactivation treatment, exposure to radiation, heating, UV curing, and the like can be given.

As a specific method of exposure to radiation, a method of exposing the first resist pattern to radiation at a dose of 2 to 20 times the optimum dose of the first resist pattern formation can be given, for example.

As a specific example of the method of the heating treatment, a method of heating at a temperature higher than the PEB temperature applied when forming the first resist pattern can be given.

As a specific method of UV curing, a method of using a lamp such as an $Ar_2$ lamp, a KrCl lamp, a $Kr_2$ lamp, an XeCl lamp, and an $Xe_2$ lamp (manufactured by USHIO, INC.) can be given.

These inactivation methods may be used either individually or in combination of two or more.

In the step (3), the second resist layer is formed by applying the second resist layer forming resin composition to the substrate on which the first resist pattern has been formed using an appropriate application method such as rotational coating, cast coating, and roll coating. With regard to the positive-working radiation-sensitive resin composition containing a crosslinking agent of the embodiment of the present invention, because the components insoluble in the solvent used for the second resist layer forming resin composition are used as the components for the polymer (B1) of the first resist layer forming resin composition, the second resist layer can be formed without causing mixing with the first resist pattern. With regard to the positive-working radiation-sensitive resin composition in which the polymer (B2) containing a crosslinking agent and an acid-unstable group are used, since such a resin composition is inactivated with heat, the second resist layer can be formed without causing mixing with the first resist pattern, and either the solvents used for the first resist layer forming resin composition and the second resist layer forming resin composition are the same or different.

Although not particularly limited, the thickness of the second resist layer is usually 10 to 1000 nm, and preferably 10 to 500 nm.

After applying the second resist layer forming resin composition, the coating may be optionally prebaked (PB) to vaporize the solvent. The heating temperature for the PB is usually about 30 to 200° C., and preferably 50 to 150° C., although the heating conditions are changed according to the composition of the resin composition.

In the step (3), a selected area on the second resist layer thus formed is exposed to radiation through a mask with a predetermined pattern, optionally, via a liquid for liquid immersion lithography such as water or a fluorine-containing inert liquid, and exposed to radiation to form a pattern latent image part (part made insoluble in alkali by exposure) in the second resist layer.

In the step (4), the exposed second resist layer is developed to cause the pattern latent image part to be exposed, thereby forming a positive-working second resist pattern in the space area of the first resist pattern.

The space area of the first resist pattern indicates the area from which the resist coating has been removed by being dissolved during development.

The developing method is the same as the developing method of the step (1).

A specific example of the pattern forming method including the above steps (1), (2), (3), and (4) using a positive-working radiation-sensitive resin composition containing a crosslinking agent (A) will be explained referring to FIGS. 1A to 1E.

Figure 1B:
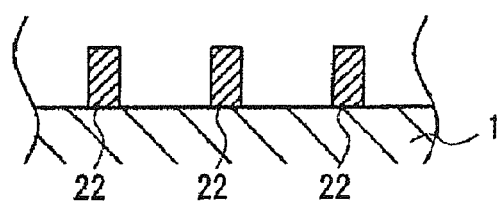

As shown in FIG. 1A, in the step (1), a pattern latent image part 21 is formed in the first resist layer 2 formed on a substrate 1 using a first resist layer forming resin composition by exposing the desired area of the first resist layer 2 to radiation (see the arrows in the Figure) through a mask 4 with a specified pattern, optionally via a liquid 3 for liquid immersion lithography such as water. The exposed resist is then developed to form a first resist pattern 22 (1L3S) on the substrate 1 as shown in FIG. 1B.

Figure 1C:
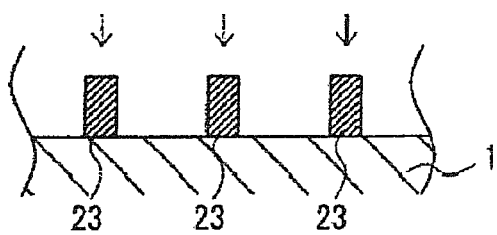

Next, in the step (2), the first resist pattern 22 is exposed to radiation as shown in FIG. 1C (see the arrows in the Figure), whereby the first resist pattern 22 is changed into an inactivated pattern 23 which is inactive to radiation.

Figure 1D:
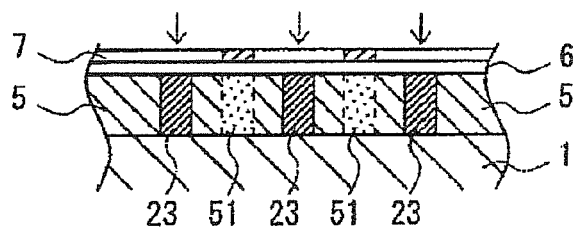

After that, in the step (3), a pattern latent image part 51 is formed in the second resist layer 5 formed on the substrate 1 on which a first resist pattern 23 has been formed using a second positive-working radiation-sensitive resin composition by exposing the desired area of the second resist layer 5 to radiation (see the arrows in the Figure) through a mask 7 with a specified pattern, optionally via a liquid 6 for liquid immersion lithography such as water, as shown in FIG. 1D.

Figure 1E:
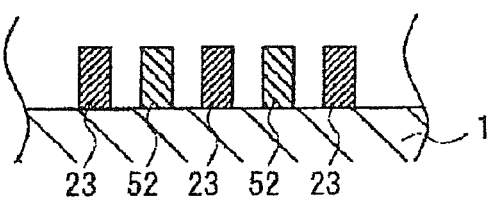

Next, in the step (4), the exposed area is developed to form a second resist pattern 52 on the space part of the inactivated first resist pattern 23, whereby a 1L1S resist pattern with the first resist pattern 23 and the second resist pattern 52 being alternately arranged on the substrate 1, as shown in FIG. 1E, is formed.

The resist pattern forming method of the embodiment of the present invention may have the following step (2') instead of the above steps (2) and (3), in which case, the method of the embodiment of the present invention may includes the above step (1), the following step (2'), and the above step (4).

Step (2'): a step of forming a second resist layer on a substrate on which the first resist layer has been formed using a the second resist layer-forming resin composition and exposing prescribed areas of the second resist layer and the above first resist layer to radiation, to inactivate the first resist pattern to radiation and, at the same time, to form the pattern latent image part in the second resist layer.

In the step (2'), the second resist layer forming resin composition is applied onto the substrate on which the first resist pattern has been formed, whereby the second resist layer is formed. The thickness of the second resist layer is the same as described. After applying the second resist layer forming resin composition, the coating may be optionally prebaked (PB) to vaporize the solvent. The prebaking conditions are the same as mentioned above.

Next, selected areas of the formed second resist layer and the above-mentioned first resist pattern are exposed to radiation through a mask with a predetermined pattern, optionally, via a liquid for liquid immersion lithography such as water or a fluorine-containing inert liquid, and exposed to radiation. In this instance, a pattern latent image part (part made insoluble in alkali by exposure) is formed on the second resist layer and, at the same time, the first resist pattern is inactivated. Therefore, when step (2') is performed, it is not necessary to perform an inactivation step by exposure. Since the number of exposure operations can be reduced in this manner, this method is economical.

The dose of radiation in the step (2') is 2 to 10 times the optimum dose applied for forming the first resist pattern and preferably the same as the optimum dose applied for forming the second resist pattern.

A specific example of the pattern forming method including the above steps (1), (2'), and (4) will be explained referring to FIGS. 2A to 2D.

Figure 2A:
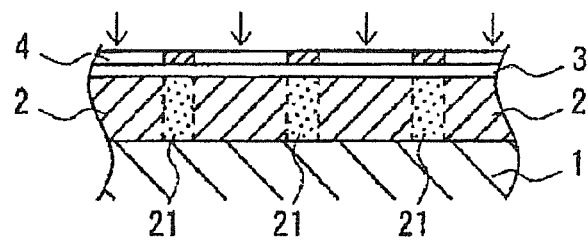
FIGS. 2A to 2D are schematic views for illustrating the steps of forming a resist pattern.
Figure 2B:
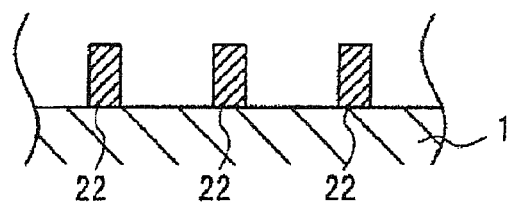

As shown in FIG. 2A, in the step (1), a pattern latent image part 21 is formed in the first resist layer 2 formed on a substrate 1 using the first resist layer forming resin composition by exposing the desired area of the first resist layer 2 to radiation (see arrows in the Figure) through a mask 4 with a specified pattern, optionally via a liquid 3 for liquid immersion lithography such as water. The exposed resist is then developed to form a first resist pattern 22 (1L3S) on the substrate 1 as shown in FIG. 2B.

Figure 2C:
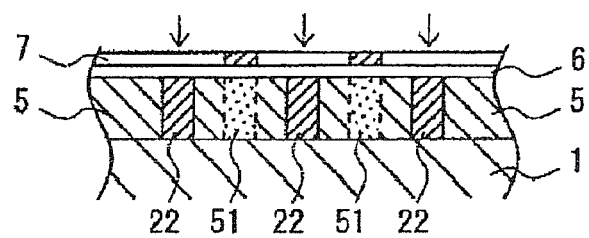

After that, in the above step (2'), desired areas of the second resist layer 5 formed on the substrate 1 on which a first resist pattern 22 has been formed using a second resist layer forming resin composition and the first resist pattern 22 are exposed to radiation (see the arrows in the Figure) through a mask 7 with a specified pattern, optionally via a liquid 6 for liquid immersion lithography such as water, as shown in FIG. 2C, whereby a pattern latent image part 51 is formed in the second resist layer 5 and, at the same time, the first resist pattern 22 is inactivated.

Figure 2D:
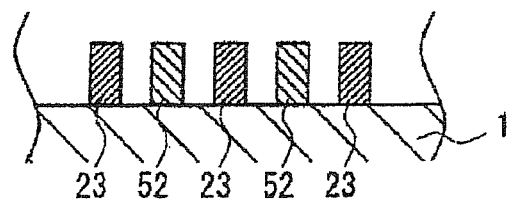

Next, in the step (4), the exposed area is developed to form a second resist pattern 52 on the space part of the inactivated first resist pattern 23, whereby a 1L1S resist pattern with the first resist pattern 23 and the second resist pattern 52 being alternately arranged on the substrate 1, as shown in FIG. 2D, is formed.

A specific example of the pattern forming method of the embodiment of the present invention including the above steps (1), (2), (3), and (4) using a positive-working radiation-sensitive resin composition in which the polymer (B2) containing a crosslinking group and an acid-unstable group is used will be explained referring to FIGS. 3A to 3E.

Figure 3A:
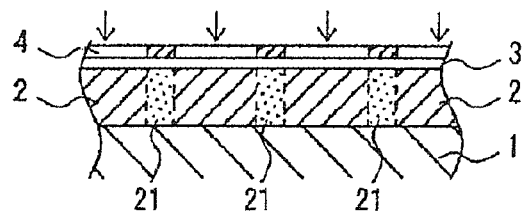
FIGS. 3A to 3E are schematic views for illustrating the steps of forming a resist pattern.
Figure 3B:
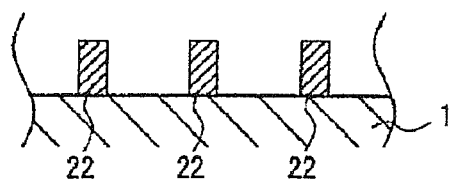

As shown in FIG. 3A, in the step (1), a pattern latent image part 21 is formed in the first resist layer 2 formed on a substrate 1 using a first resist layer forming resin composition by exposing the desired area of the first resist layer 2 to radiation (see arrows in the Figure) through a mask 4 with a specified pattern, optionally via a liquid 3 for liquid immersion lithography such as water. The exposed resist is then developed to form a first resist pattern 22 (1L3S) on the substrate 1 as shown in FIG. 3B.

Figure 3C:
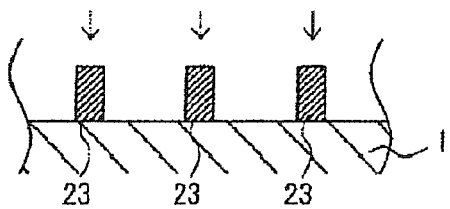

Next, in the step (2), as shown in FIG. 3C, the first resist pattern 22 is baked at a temperature of 120° C. or more, and preferably 140° C. or more to change the first resist pattern 22 into an inactivated pattern 23 which is inactive to radiation.

Figure 3D:
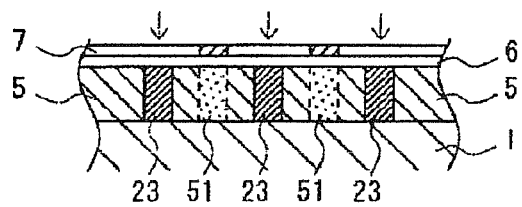

After that, in the step (3), a pattern latent image part 51 is formed in the second resist layer 5 formed on the substrate 1 on which a first resist pattern 23 has been formed using a second resist layer forming resin composition by exposing the desired area of the second resist layer 5 to radiation (see the arrows in the Figure) through a mask 7 with a specified pattern, optionally via a liquid 6 for liquid immersion lithography such as water, as shown in FIG. 3D.

Figure 3E:
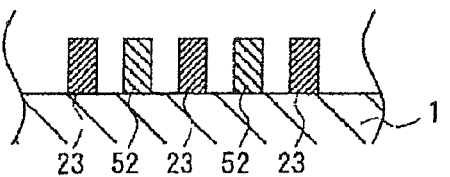

Next, in the step (4), the exposed area is developed to form a second resist pattern 52 on the space part of the inactivated first resist pattern 23, whereby a 1L1S resist pattern with the first resist pattern 23 and the second resist pattern 52 being alternately arranged on the substrate 1, as shown in FIG. 3E, is formed.

Figure 4:
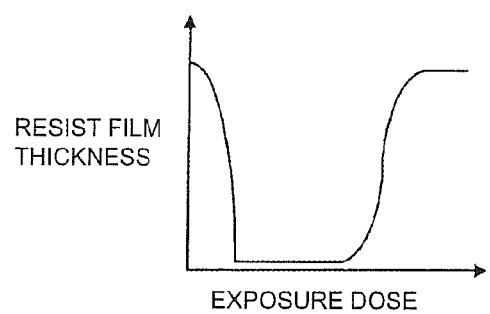
FIG. 4 is a diagrammatic chart showing the correlation of the exposure dose and the film thickness.

[2] Positive-Working Radiation-Sensitive Resin Composition for Forming First Resist Layer When a positive-working radiation-sensitive resin composition containing a crosslinking agent (A) is used, the first resist layer forming resin composition of the embodiment of the present invention includes the crosslinking agent (A), a resin containing an acid-unstable group, a radiation-sensitive acid generator (C), and a solvent (D). This resin composition exhibits both a positive-working response and a negative-working response to a certain amount of radiation. Specifically, on the low exposure dose side, the solubility increase of the composition due to the action of an acid is more than the solubility decrease due to the action of the crosslinking agent, whereby the composition exhibits a positive-working response, whereas on the high exposure dose side, the solubility decrease due to the action of the crosslinking agent is more than the solubility increase of the composition due to the action of an acid, whereby the composition exhibits a negative-working response. The relationship between the exposure dose and resist film thickness is as shown in FIG. 4.

When using the positive-working radiation-sensitive resin composition in which the polymer (B2) containing a crosslinking group and an acid-unstable group is used, the first resist layer formed from the composition containing the polymer (B2) containing a crosslinking group and an acid-unstable group, the radiation-sensitive acid generator (C), and the solvent (D) is provided with increased resistance to the second resist layer by being baked at a temperature of 140° C. or more and can thus remain without being damaged when forming the second resist.

<Crosslinking Agent (A)>

The crosslinking component used in the embodiment of the present invention is a compound having the group shown by the following formula (1) (hereinafter referred to as "crosslinking component I"),

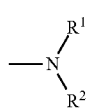
(1)

wherein $R^1$ and $R^2$ represent a hydrogen atom or a group shown by the following formula (2), at least one of $R^1$ and $R^2$ being a group shown by the following formula (2),

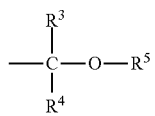
(2)

wherein $R^3$ and $R^4$ represent a hydrogen atom, an alkyl group having 1 to 6 carbon atoms, or an alkoxyalkyl group having 1 to 6 carbon atoms, or $R^3$ and $R^4$ bond together to form a ring having 2 to 10 carbon atoms, and $R^5$ represents a hydrogen atom or an alkyl group having 1 to 6 carbon atoms, a compound having two or more epoxy groups or oxetane groups (hereinafter referred to as "crosslinking component II"), or a compound having two or more vinyl groups and a skeleton shown by any one of the following formulas (12-1) to (12-4) (hereinafter referred to as "crosslinking component III"),

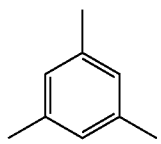
(12-1)

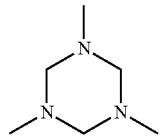
(12-2)

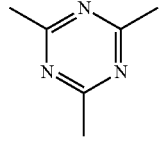
(12-3)

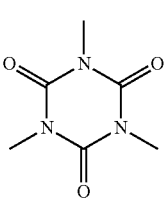
(12-4)

or a mixture of the crosslinking component I, the crosslinking component II, and the crosslinking component III.

The above-mentioned crosslinking components act as a crosslinking component (curing component) with which the resin containing a hydroxyl group mentioned above and/or the crosslinking components mutually react with the action of an acid.

As specific examples of the compound shown by the formula 1 (the crosslinking component I), nitrogen-containing compounds prepared by alkyl-ethrification of all or a part of active methylol groups of a compound such as (poly)methylolized melamine, (poly)methylolized glycoluril, (poly)methylolized benzoguanamine, (poly)methylolized urea, and the like can be given. As examples of the alkyl group, a methyl group, ethyl group, butyl group, or a mixture of these groups can be given, and may include an oligomer component which is made by partly self condensation. As specific examples, hexamethoxymethylated melamine, hexabutoxymethylated melamine, tetramethoxymethylated glycoluril, tetrabutoxymethylated glycoluril, and the like can be given.

As commercially available compounds, Cymel 300, Cymel 301, Cymel 303, Cymel 350, Cymel 232, Cymel 235, Cymel 236, Cymel 238, Cymel 266, Cymel 267, Cymel 285, Cymel 1123, Cymel 1123-10, Cymel 1170, Cymel 370, Cymel 771, Cymel 272, Cymel 1172, Cymel 325, Cymel 327, Cymel 703, Cymel 712, Cymel 254, Cymel 253, Cymel 212, Cymel 1128, Cymel 701, Cymel 202, and Cymel 207 (manufactured by Nihon Cytec Industries, Inc.), Nikalac MW-30M, Nikalac MW-30, Nikalac MW-22, Nikalac MW-24X, Nikalac MS-21, Nikalac MS-11, Nikalac MS-001, Nikalac MX-002, Nikalac MX-730, Nikalac MX-750, Nikalac MX-708, Nikalac MX-706, Nikalac MX-042, Nikalac MX-035, Nikalac MX-45, Nikalac MX-410, Nikalac MX-302, Nikalac MX-202, Nikalac SM-651, Nikalac SM-652, Nikalac SM-653, Nikalac SM-551, Nikalac SM-451, Nikalac SB-401, Nikalac SB-355, Nikalac SB-303, Nikalac SB-301, Nikalac SB-255, Nikalac SB-203, Nikalac SB-201, Nikalac BX-4000, Nikalac BX-37, Nikalac BX-55H, and Nikalac BL-60 (manufactured by Sanwa Chemical Co., Ltd.), and the like can be given. Cymel 325, Cymel 327, Cymel 703, Cymel 712, Cymel 254, Cymel 253, Cymel 212, Cymel 1128, Cymel 701, Cymel 202, and Cymel 207 which are the compounds of the formula (1) in which either R¹ or R² is a hydrogen atom, that is, crosslinking components having an imino group, are preferable.

As examples of the crosslinking component II which contains two or more epoxy groups or oxetane groups as reactive groups, epoxy cyclohexyl group-containing compounds such as 3,4-epoxycyclohexylmethyl-3',4'-epoxycyclohexanecarboxylate, 2-(3,4-epoxycyclohexyl-5,5-spiro-3,4-epoxy)cyclohexane-m-dioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexanecarboxylate, methylenebis(3,4-epoxycyclohexane), ethylene glycol di(3,4-epoxycyclohexylmethyl)ether, ethylenebis(3,4-epoxycyclohexanecarboxylate), ε-caprolactone-modified 3,4-epoxycyclohexylmethyl-3',4'-epoxycyclohexanecarboxylate, trimethylcaprolactone-modified 3,4-epoxycyclohexylmethyl-3',4'-epoxycyclohexanecarboxylate, and β-methyl-δ-valerolactone-modified 3,4-epoxycyclohexylmethyl-3',4'-epoxycyclohexanecarboxylate; bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ethers; polydiglycidyl ethers of polyether polyol obtained by adding one or more alkylene oxides to an aliphatic polyhydric alcohol such as ethylene glycol, propylene glycol, and glycerol; diglycidyl esters of an aliphatic long-chain dibasic acid; mono-diglycidyl ethers of aliphatic higher alcohol; phenol, cresol, butyl phenol, or mono-glycidyl ethers of polyether alcohol obtained by adding an alkylene oxide to these; glycidyl esters of a higher fatty acid,
oxetane compounds having two or more oxetane rings in the molecule such as 3,7-bis(3-oxetanyl)-5-oxa-nonane, 3,3'-(1, 3-(2-methylenyl)propanediylbis(oxymethylene))bis-(3-ethyloxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl) ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, ethylene oxide (EO)-modified bisphenol A bis(3-ethyl-3-oxetanylmethyl)ether, propylene oxide (PO)-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F (3-ethyl-3-oxetanylmethyl) ether, and the like can be given. As examples of commercially available products among the specific examples of the crosslinking component II, ARONOXETANE OXT-101, OXT-121, and OXT-221 (manufactured by Toagosei Chemical Co., Ltd.), OXTP, OXBP, and OXIPA (manufactured by Ube Industries, Ltd.), and the like can be given.

Of these, 1,6-hexanediol diglycidyl ether and dipentaerythritol hexakis(3-ethyl-3-oxetanylmethyl)ether are preferable as the crosslinking component II.

As examples of the compound of the crosslinking component III having two or more vinyl groups as reactive groups and containing at least one of the groups shown by the formulas (12-1) to (12-4), 1,3,5-triacryloylhexahydro-1,3,5-triazine, triallyl-1,3,5-benzenetricarboxylate, 2,4,6-triallyloxy-1,3,5-triazine, and 1,3,5-triallyl-1,3,5-triazine-2,4,6(1H,3H, 5H)-trione can be given.

Of these, 1,3,5-triallyl-1,3,5-triazine-2,4,6(1H,3H,5H)-trione is preferable as the crosslinking component III.

The amount of the crosslinking agents in the embodiment of the present invention is 1 to 30 parts by mass, and preferably 2 to 25 parts by mass for 100 parts by mass of the resin. If less than 1 part by mass, the degree of inactivation to radiation is insufficient, which may result in an impaired pattern. If more than 30 parts by mass, the pattern may not be resolved.

<Resin (B) Containing Acid-Unstable Group>

Although not particularly limited, in order for the radiation-sensitive resin composition to exhibit the effect of the crosslinking agent (A), the resin (B) containing an acid-unstable group (hereinafter referred to as "resin (B)") is preferably insoluble or scarcely soluble in alkali, but becomes soluble in alkali by the action of an acid in an environment in which a radiation dose is small, and is made inactive to radiation by the action of the crosslinking agent (A) in an environment in which a radiation dose is large. The term "alkali-insoluble" or "scarcely alkali-soluble" refers to properties in which 50% or more of the initial thickness of the resist film remains after development, in the case of developing a film using only the resin (B) instead of a resist film under alkaline development conditions employed when forming a resist pattern of the resist film formed from the first resist layer forming resin composition containing the resin (B).

The resin (B) preferably has a repeating unit which contains an acid-unstable group shown by the following formula (3) and a repeating unit which contains a lactone structure shown by at least one of the following formulas (4-1) to (4-6),

(3)

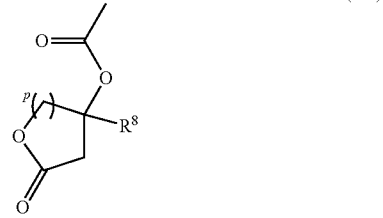

(4-1)

-continued (4-2)
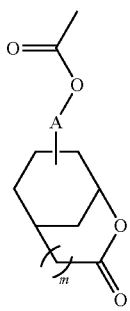

(4-3)
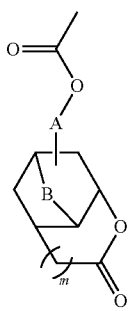

(4-4)
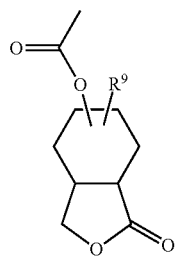

(4-5)
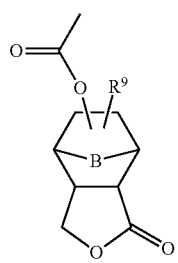

(4-6)
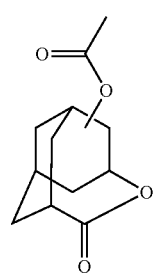

wherein $R^6$ represents a hydrogen atom, a methyl group, or a trifluoromethyl group, and $R^7$ individually represents a monovalent alicyclic hydrocarbon group having 4 to 20 carbon atoms, a derivative thereof, or a linear or branched alkyl group having 1 to 4 carbon atoms.

As examples of the monovalent alicyclic hydrocarbon group having 4 to 20 carbon atoms represented by $R^7$ in the formula (3), groups containing an alicyclic ring derived from norbornane, tricyclodecane, tetracyclododecane, or adamantane, or cycloalkanes such as cyclobutane, cyclopentane, cyclohexane, cycloheptane, and cyclooctane; groups in which the above group containing an alicyclic ring is substituted with at least one of cyclic, branched, or linear alkyl groups having 1 to 4 carbon atoms such as a methyl group, an ethyl group, an n-propyl group, an i-propyl group, an n-butyl group, a 2-methylpropyl group, a 1-methylpropyl group, and a t-butyl group; and the like can be given. Any two groups represented by $R^7$ may form a divalent alicyclic hydrocarbon group or a derivative thereof in combination with the carbon atom to which these two groups bond. Of these alicyclic hydrocarbon groups, an alicyclic ring derived from norbornane, tricyclodecane, tetracyclododecane, adamantane, cyclopentane, or cyclohexane, a group in which such an alicyclic ring is substituted with any one of the above alkyl groups, and the like are preferable.

As examples of the linear or branched alkyl group having 1 to 4 carbon atoms represented by $R^7$ in the formula (3), a methyl group, an ethyl group, an n-propyl group, an i-propyl group, an n-butyl group, a 2-methylpropyl group, a 1-methylpropyl group, and a t-butyl group can be given.

As preferable examples of —$C(R^7)_3$ in the formula (3), a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl)pentyl group, 1-(1,1-diethyl)propyl group, a 1-n-(1,1-diethyl)butyl group, a 1-n-(1,1-diethyl)pentyl group, a 1-(1-methyl)cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-{1-methyl-1-(2-norbornyl)}ethyl group, a 1-{1-methyl-1-(2-tetracyclodecanyl)}ethyl group, a 1-{1-methyl-1-(1-adamantyl)}ethyl group, a 2-(2-methyl)norbornyl group, a 2-(2-ethyl)norbornyl group, a 2-(2-n-propyl)norbornyl group, a 2-(2-i-propyl)norbornyl group, a 2-(2-methyl)tetracyclodecanyl group, a 2-(2-ethyl)tetracyclodecanyl group, a 2-(2-n-propyl)tetracyclodecanyl group, a 2-(2-i-propyl)tetracyclodecanyl group, a 1-(1-methyl)adamantyl group, a 1-(1-ethyl)adamantyl group, a 1-(1-n-propyl)adamantyl group, and a 1-(1-i-propyl)adamantyl group; groups in which these groups are substituted by one or more cyclic, branched, or linear alkyl groups having 1 to 4 carbon atoms such as a methyl group, an ethyl group, a n-propyl group, an i-propyl group, an n-butyl group, a 2-methylpropyl group, a 1-methylpropyl group, and a t-butyl group; and the like can be given.

As preferable examples of the monomer providing the repeating unit (3), 2-methyladamantyl-2-yl(meth)acrylate, 2-methyl-3-hydroxyadamantyl-2-yl(meth)acrylate, 2-ethyladamantyl-2-yl(meth)acrylate, 2-ethyl-3-hydroxyadamantyl-2-yl(meth)acrylate, 2-n-propyladamantyl-2-yl(meth)acrylate, 2-isopropyladamantyl-2-yl(meth)acrylate, 2-methylbicyclo[2.2.1]hept-2-yl(meth)acrylate, 2-ethylbicyclo[2.2.1]hept-2-yl(meth)acrylate, 8-methyltricyclo[5.2.1.0$^{2,6}$]decan-8-yl(meth)acrylate, 8-ethyltricyclo[5.2.1.0$^{2,6}$]decan-8-yl(meth)acrylate, 4-methyltetracyclo[6.2.1$^{3,6}$.0$^{2,7}$]dodecan-4-yl(meth)acrylate, 4-ethyltetracyclo[6.2.1$^{3,6}$.0$^{2,7}$]dodecan-4-yl(meth)acrylate, 1-(bicyclo[2.2.1]hept-2-yl)-1-methylethyl(meth)acrylate, 1-(tricyclo[5.2.1.0$^{2,6}$]decan-8-yl)-1-methylethyl(meth)acrylate, 1-(tetracyclo[6.2.1$^{3,6}$.0$^{2,7}$]dodecan-4-yl)-1-methylethyl(meth)acrylate, (adamantan-1-yl)-1-methylethyl(meth)acrylate, 1-(3-hydroxyadamantan-1-yl)-1-methylethyl(meth)acrylate, 1,1-dicyclohexylethyl(meth)acrylate, 1,1-di(bicyclo[2.2.1]hept-2-yl)ethyl(meth)acrylate, 1,1-di(tricyclo[5.2.1.0$^{2,6}$]decan-8-yl)ethyl(meth)acrylate, 1,1-di(tetracyclo[6.2.1$^{3,6}$.0$^{2,7}$]dodecan-4-yl)ethyl(meth)acrylate, 1,1-di (adamantan-1-yl)ethyl(meth)acrylate, a 1-methyl-1-cyclopentyl(meth)acrylate, 1-ethyl-1-cyclopentyl(meth) acrylate, 1-methyl-1-cyclohexyl(meth)acrylate, and 1-ethyl-1-cyclohexyl(meth)acrylate can be given. In the embodiment of the present invention,(meth)acrylate refers to both acrylate and methacrylate.

Of these monomers, 2-methyladamantyl-2-yl(meth)acrylate, 2-ethyladamantyl-2-yl(meth)acrylate, 2-methylbicyclo[2.2.1]hept-2-yl(meth)acrylate, 2-ethylbicyclo[2.2.1]hept-2-yl(meth)acrylate, 1-(bicyclo[2.2.1]hept-2-yl)-1-methylethyl(meth)acrylate, 1-(adamantan-1-yl)-1-methylethyl(meth) acrylate, 1-methyl-1-cyclopentyl(meth)acrylate, 1-ethyl-1-cyclopentyl(meth)acrylate, 1-methyl-1-cyclohexyl(meth) acrylate, 1-ethyl-1-cyclohexyl(meth)acrylate and the like are particularly preferable.

The resin (B) may contain only one type of repeating unit (3) or two or more types of repeating units (3).

In the formulas (4-1) to (4-6), $R^8$ represents a hydrogen atom or a substituted or unsubstituted alkyl group having 1 to 4 carbon atoms, $R^9$ represents a hydrogen atom or a methoxy group, A represents a single bond or a methylene group, B represents an oxygen atom or a methylene group, p is an integer of 1 to 3, and m is 0 or 1.

As examples of the substituted or unsubstituted alkyl group having 1 to 4 carbon atoms represented by $R^8$ in the formula (4-1), a methyl group, an ethyl group, an n-propyl group, an i-propyl group, an n-butyl group, a 2-methylpropyl group, a 1-methylpropyl group, a t-butyl group, and the like can be given.

As examples of the monomer providing the repeating units (4-1) to (4-6), 5-oxo-4-oxa-tricyclo[4.2.1.0$^{3,7}$]non-2-yl (meth)acrylate, 9-methoxycarbonyl-5-oxo-4-oxa-tricyclo [4.2.1.0$^{3,7}$]non-2-yl(meth)acrylate, 5-oxo-4-oxa-tricyclo [5.2.1.0$^{3,8}$]dec-2-yl(meth)acrylate, (10-methoxycarbonyl-5-oxo-4-oxa-tricyclo[5.2.1.0$^{3,8}$]non-2-yl(meth)acrylate, 6-oxo-7-oxa-bicyclo[3.2.1]oct-2-yl(meth)acrylate, 4-methoxycarbonyl-6-oxo-7-oxa-bicyclo[3.2.1]oct-2-yl(meth) acrylate, 7-oxo-8-oxa-bicyclo[3.3.1]oct-2-yl(meth)acrylate, 4-methoxycarbonyl-7-oxo-8-oxa-bicyclo[3.3.1]oct-2-yl (meth)acrylate, 2-oxotetrahydropyran-4-yl(meth)acrylate, 4-methyl-2-oxotetrahydropyran-4-yl(meth)acrylate, 4-ethyl-2-oxotetrahydropyran-4-yl(meth)acrylate, 4-propyl-2-oxotetrahydropyran-4-yl(meth)acrylate, 5-oxo-tetrahydrofuran-3-yl(meth)acrylate, 2,2-dimethyl-5-oxotetrahydrofuran-3-yl(meth)acrylate, 4,4-dimethyl-5-oxotetrahydrofuran-3-yl (meth)acrylate, 2-oxotetrahydrofuran-3-yl(meth)acrylate, 4,4-dimethyl-2-oxotetrahydrofuran-3-yl(meth)acrylate, 5,5-dimethyl-2-oxotetrahydrofuran-3-yl(meth)acrylate, 2-oxotetrahydrofuran-3-yl(meth)acrylate, 5-oxotetrahydrofuran-2-ylmethyl(meth)acrylate, 3,3-dimethyl-5-oxotetrahydrofuran-2-ylmethyl(meth)acrylate, methyl 4,4-dimethyl-5-oxotetrahydrofuran-2-ylmethyl(meth)acrylate, and the like can be given.

The resin (B) may contain only one type of repeating unit or two or more types of the repeating units (4-1) to (4-6).

The resin (B) of the embodiment of the present invention may include one or more repeating units other than the repeating unit (3) or the repeating units (4-1) to (4-6) (hereinafter referred to as "other repeating units").

As examples of the other repeating units, a repeating unit of the following formula (5) (hereinafter called "repeating unit (5)"), a repeating unit of the following formula (6) (hereinafter called "repeating unit (6)"), and a repeating unit of the following formula (7) (hereinafter called "repeating unit (7)") can be given.

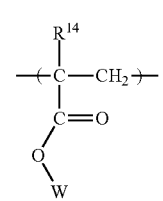

(5)

wherein $R^{14}$ represents a hydrogen atom, a methyl group, or a trifluoromethyl group and W represents an alicyclic hydrocarbon group having 7 to 20 carbon atoms which may be substituted or unsubstituted with an alkyl group having 1 to 4 carbon-atoms, a hydroxyl group, a cyano group, or a hydroxy alkyl group having 1 to 10 carbon atoms.

As examples of the substituted or unsubstituted polyalicyclic hydrocarbon group having 7 to 20 carbon atoms represented by W of the repeating unit (5), hydrocarbon groups originating from cycloalkanes such as bicyclo[2.2.1]heptane (5a), bicyclo[2.2.2]octane (5b), tricyclo[5.2.1.0$^{2,6}$]decane (5c), tetracyclo[6.2.1.1$^{3,6}$.0$^{2,7}$]dodecane (5d), and tricyclo [3.3.1.1$^{3,7}$]decane (5e) which are shown by the following formulas can be given.

(5a)

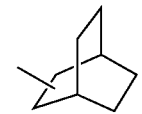

(5b)

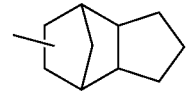

(5c)

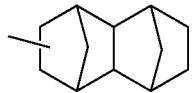

(5d)

(5e)

When the hydrocarbon group originating from the cycloalkanes has a substituent, cyclic, branched, or liner alkyl groups having 1 to 4 carbon atoms such as a methyl group, an ethyl group, an n-propyl group, an i-propyl group, an n-butyl group, a 2-methylpropyl group, a 1-methylpropyl group, and a t-butyl group can be given as examples of the substituents. They are not limited to the compounds substituted with the above alkyl groups and may include compounds substituted with a hydroxyl group, a cyano group, a hydroxyalkyl group having 1 to 10 carbon atoms, a carboxyl group, or oxygen.

As examples of the monomer providing the repeating unit (5), bicyclo[2.2.1]heptyl(meth)acrylate, cyclohexyl(meth) acrylate, bicyclo[4.4.0]decanyl(meth)acrylate, bicyclo [2.2.2]octyl(meth)acrylate, tricyclo[5.2.1.0$^{2,6}$]decanyl (meth)acrylate, tetracyclo[6.2.1.1$^{3,6}$.0$^{2,7}$]dodecanyl(meth)acrylate, and tricyclo[3.3.1.1$^{3,7}$]decanyl(meth)acrylate can be given.

The resin (B) may contain only one type of repeating unit (5) or two or more types of repeating unit (5).

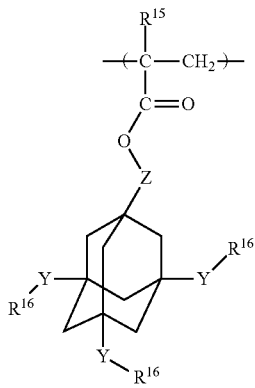

(6)

wherein $R^{15}$ represents a hydrogen atom or a methyl group, Z represents a single bond or a divalent organic group having 1 to 3 carbon atoms, Y individually represents a single bond or a divalent organic group having 1 to 3 carbon atoms, $R^{16}$ individually represents a hydrogen atom, a hydroxyl group, a cyano group, or a COOR$^{17}$ group, (wherein $R^{17}$ represents a hydrogen atom, a linear or branched alkyl group having 1 to 4 carbon atoms, or an alicyclic alkyl group having 3 to 20 carbon atoms), at least one of the three $R^{16}$s is not a hydrogen atom and when Z is a single bond, at least one of the three Ys is a divalent organic group having 1 to 3 carbon atoms.

As examples of the divalent organic group having 1 to 3 carbon atoms represented by Z and Y in the repeating unit (6), a methylene group, an ethylene group, and a propylene group can be given.

Examples of the linear or branched alkyl group having 1 to 4 carbon atoms represented by $R^{17}$ in the group COOR$^{17}$ include a methyl group, an ethyl group, an n-propyl group, an i-propyl group, an n-butyl group, a 2-methylpropyl group, a 1-methylpropyl group, and a t-butyl group.

As examples of the alicyclic alkyl group having 3 to 20 carbon atoms represented by $R^{17}$, cycloalkyl groups shown by the formula —C$_t$H$_{2t-1}$ (wherein t is an integer of 3 to 20), polyalicyclic groups, and the like can be given. Examples of the cycloalkyl group include a cyclopropyl group, cyclobutyl group, cyclopentyl group, cyclohexyl group, a cycloheptyl group, and a cyclooctyl group. In addition, as examples of the polyalicyclic group, a bicyclo[2.2.1]heptyl group, a tricyclo[5.2.1.0$^{2,6}$]decyl group, a tetracyclo[6.2.1.1$^{3,6}$.0$^{2,7}$]dodecanyl group, and adamantyl group can be given. The cycloalkyl group or the polycyclic alicyclic alkyl group may be substituted with one or more linear, branched, or cyclic alkyl group. These substituents may be two or more different groups.

As examples of the monomer providing with the repeating unit (6), 3-hydroxyadamantan-1-ylmethyl(meth)acrylate, 3,5-dihydroxyadamantan-1-ylmethyl(meth)acrylate, 3-hydroxy-5-methyladamantan-1-yl(meth)acrylate, 3,5-dihydroxy-7-methyladamantan-1-yl(meth)acrylate, 3-hydroxy-5,7-dimethyladamantan-1-yl(meth)acrylate, and 3-hydroxy-5,7-dimethyladamantan-1-ylmethyl(meth)acrylate can be given.

The resin (B) may contain only one type of repeating unit (6) or two or more types of repeating units (6).

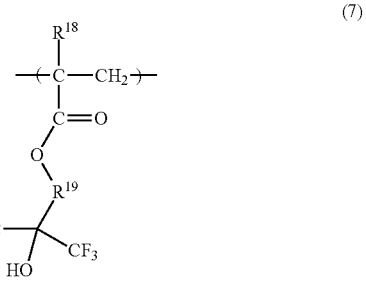

(7)

wherein $R^{18}$ represents a hydrogen atom, an alkyl group having 1 to 4 carbon atoms, a trifluoromethyl group, or a hydroxymethyl group, and $R^{19}$ represents a divalent organic group.

As examples of the alkyl group having 1 to 4 carbon atoms represented by $R^{18}$ in the repeating unit (7), a methyl group, an ethyl group, an n-propyl an group, i-propyl group, an n-butyl group, a 2-methylpropyl group, a 1-methylpropyl group, and a t-butyl group can be given.

The divalent organic group represented by $R^{19}$ in the repeating unit (7) is preferably a divalent hydrocarbon group. Among the divalent hydrocarbon groups, a chain or cyclic hydrocarbon group is preferable. Such a group may also be an alkylene glycol group, an alkylene ester group, or the like.

Specific examples include saturated linear hydrocarbon groups such as a methylene group, an ethylene group, a propylene group (e.g., 1,3-propylene group, 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group;

monocycle hydrocarbon ring groups, for example, cycloalkylene groups having 3 to 10 carbon atoms, such as cyclobutylene groups (e.g., 1,3-cyclobutylene group), cyclopentylene groups (e.g., 1,3-cyclopentylene group), cyclohexylene groups (e.g., 1,4-cyclohexylene group), and cyclooctylene groups (e.g., 1,5-cyclooctylene group); bridged cyclic hydrocarbon ring groups having 4 to 30 carbon atoms in 2 to 4 rings, for example, norbornylene groups (e.g., 1,4-norbornylene group, 2,5-norbornylene group) and admantylene groups (e.g., 1,5-admantylene group and 2,6-admantylene group); and the like. Among the above groups, a hydrocarbon group having a 2,5-norbornylene group, a 1,2-ethylene group, and a propylene group is preferable as $R^{19}$.

When as $R^{19}$ includes a divalent alicyclic hydrocarbon group, it is preferable to insert an alkylene group having 1 to 4 carbon atoms as a spacer between the bistrifluoromethyl hydroxyl methyl group [—C(CF$_3$)$_2$OH] and the divalent alicyclic hydrocarbon group.

As preferable examples of the monomer providing the repeating unit (7), (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl) (meth)acrylate, 2-{[5-(1',1',1'-trifluoro-2'-trifluoromethyl-2'-hydroxy)propyl]bicyclo[2.2.1]heptyl}(meth)acrylate, 3-{[8-(1',1',1'-trifluoro-2'-trifluoromethyl-2'-hydroxy)propyl] tetracyclo[6.2.1.1$^{3,6}$.0$^{2,7}$]dodec yl}(meth)acrylate, and the like can be given.

The resin (B) may contain only one type of repeating unit (7) or two or more types of repeating units (7).

Examples of the repeating units other than the repeating units (5) to (7) (hereinafter referred to from time to time as "repeating unit (15)") include units obtainable by cleavage of a polymerizable unsaturated bond of a polyfunctional monomer such as (meth)acrylates having a bridged hydrocarbon skeleton such as dicyclopentenyl(meth)acrylate and adamantylmethyl(meth)acrylate; carboxyl group-containing esters having a bridged hydrocarbon skeleton of unsaturated carboxylic acid such as carboxynorbornyl(meth)acrylate, carboxytricyclodecanyl(meth)acrylate, and carboxytetracycloundecanyl(meth)acrylate;
(meth)acrylates having no bridged hydrocarbon skeleton such as methyl(meth)acrylate, ethyl(meth)acrylate, n-propyl (meth)acrylate, n-butyl(meth)acrylate, 2-methylpropyl (meth)acrylate, 1-methylpropyl(meth)acrylate, t-butyl(meth) acrylate, 2-hydroxyethyl(meth)acrylate, 2-hydroxypropyl (meth)acrylate, 3-hydroxypropyl(meth)acrylate, cyclopropyl (meth)acrylate, cyclopentyl(meth)acrylate, cyclohexyl (meth)acrylate, 4-methoxycyclohexyl(meth)acrylate, 2-cyclopentyloxycarbonylethyl(meth)acrylate, 2-cyclohexyloxycarbonylethyl(meth)acrylate, and 2-(4-methoxy cyclohexyl)oxycarbonylethyl(meth)acrylate;
α-hydroxymethylacrylates such as methyl α-hydroxymethyl acrylate, ethyl α-hydroxymethyl acrylate, n-propyl α-hydroxymethyl acrylate, and n-butyl-α-hydroxymethyl acrylate; unsaturated nitryl compounds such as (meta)acrylonitrile, α-chloroacrylonitrile, crotonitrile, maleinitrile, fumarnitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; unsaturated carboxylic acid (anhydride) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters having no bridged hydrocarbon skeleton of unsaturated carboxylic acid such as 2-carboxyethyl(meth)acrylate, 2-carboxypropyl(meth)acrylate, 3-carboxypropyl(meth)acrylate, 4-carboxybutyl(meth)acrylate, and 4-carboxycyclohexyl (meth)acrylate;
polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth) acrylate; and
polyfunctional monomers having no bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl) benzene di(meth)acrylate, and 1,3-bis(2-hydroxypropyl)benzene di(meth)acrylate.

Of these repeating units (15), the units obtained by cleavage of a polymerizable unsaturated bond of (meth)acrylates having a bridged hydrocarbon skeleton and the like are preferable.

It is preferable that the resin (B) of the embodiment of the present invention contain at least one other repeating unit selected from these other repeating units.

<Resin (B2) Containing Crosslinking Group and Acid-Unstable Group>

The polymer (B2) having a crosslinking group and an acid-unstable group (hereinafter referred as "polymer (B2)") has either or both of the following crosslinking groups bonded to the polymer (B1) mentioned above.

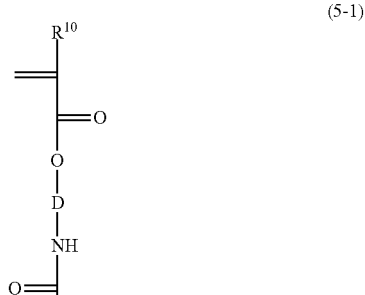

(5-1)

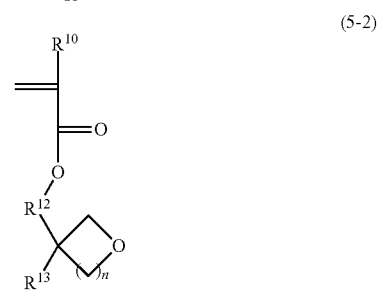

(5-2)

wherein R$^{10}$ represents a hydrogen atom, a methyl group, or a trifluoromethyl group, D represents a methylene group, an ethylene group, or a propylene group; and R$^{11}$ is a group shown by the following formula (5-1-A) or the following formula (5-1-B).

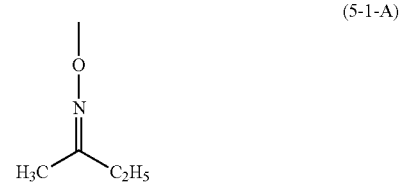

(5-1-A)

(5-1-B)

In the formula (5-2), R$^{10}$ represents a hydrogen atom, a methyl group, or a trifluoromethyl group, R$^{12}$ represents a methylene group or an alkylene group having 2 to 6 carbon atoms, $R^{13}$ represents a hydrogen atom, a methyl group, or an ethyl group, and n is 0 or 1.

The content of the repeating unit (3) in the polymer (B1) or polymer (B2) of the first resist layer forming resin composition of the embodiment of the present invention is preferably 10 to 90 mol %, and more preferably 10 to 80 mol %, and still more preferably 20 to 70 mol % for 100 mol % of all the repeating units contained in the polymer (B1). If the content of the repeating unit (3) is less than 10 mol %, resolution as a resist film may decrease. If more than 90 mol %, the developability of the resist film may decrease.

The content of the repeating units (4-1) to (4-6) is preferably 5 to 70 mol %, more preferably 5 to 65 mol %, and still more preferably 10 to 60 mol % for 100 mol % of all the repeating units contained in the polymer (B1) or the polymer (B2). If the content of the repeating unit (4) is less than 5 mol %, developability and process margin as a resist may decrease.

The content of the repeating unit (5) is preferably 30 mol % or less, and more preferably 25 mol % or less for 100 mol % of all repeating units contained in the polymer (B1) or polymer (B2). If the content of the repeating unit (5) is more than 30 mol %, the resist film produced tends to swell in an alkali developer and solubility in an alkali developer may decrease.

The content of the repeating unit (6) is preferably 30 mol % or less, and more preferably 25 mol % or less for 100 mol % of all repeating units contained in the polymer (B1) or polymer (B2). If the content of the repeating unit (6) is more than 30 mol %, the resist film produced tends to swell in an alkali developer and solubility in an alkali developer may decrease.

The content of the repeating unit (7) is preferably 30 mol % or less, and more preferably 25 mol % or less for 100 mol % of all repeating units contained in the polymer (B1) or polymer (B2). If the content of the repeating unit (7) is more than 30 mol %, a top loss of the resist pattern may be produced, giving rise to the possibility of impairing the pattern profile.

The first resist layer forming resin composition may contain only one type of the polymer (B1) or the polymer (B2) or may contain two or more of types of the polymer (B1) and the polymer (B2).

The resin (B1) or the resin (B2) in the embodiment of the present invention may be prepared by polymerizing the polymerizable unsaturated monomers for constituting the above described each repeating unit in an appropriate solvent in the presence of a chain transfer agent, as required, using a radical polymerization initiator such as a hydroperoxides, dialkyl peroxides, diacyl peroxides, or azo compounds.

As examples of the solvent used for polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ketones such as acetone, 2-butanone, 4-methyl-2-pentanone, and 2-heptanone; and ethers such as tetrahydrofuran, dimethoxyethanes, and diethoxyethanes can be given. These solvents may be used either individually or in combination of two more.

The polymerization temperature is usually 40 to 150° C., and preferably 50 to 120° C. The reaction time is usually 1 to 48 hours, and preferably 1 to 24 hours.

Although not particularly limited, the polystyrene-reduced weight average molecular weight (hereinafter referred to from time to time as "Mw") of the polymer (B1) or the polymer (B2) determined by gel permeation chromatography (GPC) is preferably 1000 to 100,000, more preferably 1000 to 30,000, and still more preferably 1000 to 20,000. If the Mw of the polymer (B1) or the polymer (B2) is less than 1000, the heat resistance of the resist film may decrease. If the Mw of the resin is more than 100,000, the developability of the resist film may decrease.

The ratio of the Mw to the polystyrene-reduced number average molecular weight (hereinafter referred to as "Mn") determined by gel permeation chromatography (GPC) (Mw/Mn) of the polymer (B1) or the polymer (B2) is usually 1 to 5, and preferably 1 to 3.

The polymer (B1) or the polymer (B2) may contain low molecular weight components originating from the monomers used when preparing the resin. The amount of the low molecular weight components in the polymer (B1) or the polymer (B2) is preferably not more than 0.1 mass %, more preferably not more than 0.07 mass %, and still more preferably not more than 0.05 mass % for 100 mass % (reduced to solid components) of the polymer (B1) or the polymer (B2). When this content is not more than 0.1 mass %, the amount of elusion in the liquid for liquid immersion lithography such as water with which the resist film comes in contact during exposure can be reduced. In addition, it is possible to prevent generation of extraneous substances in the resist during storage, inhibit uneven resist application, and sufficiently suppress production of defects during resist pattern formation.

The low molecular weight components may be components having an Mw of 500 or less such as monomers, dimers, trimers, and oligomers. The low molecular weight components (components having an Mw of 500 or less) may be removed by purification using a chemical purification process such as washing with water or liquid-liquid extraction or a combination of the chemical purification process and a physical purification process such as ultrafiltration or centrifugation, for example. The content of the low molecular weight components may be determined by high performance liquid chromatography (HPLC).

It is preferable that the polymer (B1) or the polymer (B2) contain only a small amount of impurities such as halogens and metals. The sensitivity, resolution, process stability, pattern shape, and the like of the formed resist film can be improved by reducing such impurities.

The polymer (B1) or the polymer (B2) can be purified using, for example, a chemical purification method such as washing with water or liquid-liquid extraction or a combination of the chemical purification method and a physical purification method such as ultrafiltration or centrifugation.

<Radiation-Sensitive Acid Generator (C)>

The radiation-sensitive acid generator (hereinafter referred to from time to time as "acid generator") generates an acid by being exposed to radiation and causes an acid-dissociable group, specifically, the acid-dissociable group possessed by the repeating unit (3) in the polymer component, to dissociate (disconnect a blocking group) by the action of the acid generated upon exposure. As a result, an exposed part of the resist film becomes readily soluble in an alkaline developer, thereby forming a positive-working resist pattern.

As such an acid generator, a compound shown by the following formula (8) (hereinafter referred to as an "acid generator 1") is preferable.

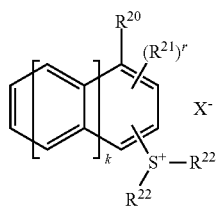

(8)

wherein $R^{20}$ represents a hydrogen atom, a fluorine atom, a hydroxyl group, a linear or branched alkyl group having 1 to 10 carbon atoms, a linear or branched alkoxyl group having 1 to 10 carbon atoms, or a linear or branched alkoxycarbonyl group having 2 to 11 carbon atoms, $R^{21}$ represents a linear or branched alkyl group having 1 to 10 carbon atoms, a linear or branched alkoxyl group having 1 to 10 carbon atoms, or a linear, branched, or cyclic alkanesulfonyl group having 1 to 10 carbon atoms, $R^{22}$ individually represents a linear or branched alkyl group having 1 to 10 carbon atoms, a substituted or unsubstituted phenyl group, or a substituted or unsubstituted naphthyl group, or two $R^{22}$ groups bond to form a substituted or unsubstituted divalent group having 2 to 10 carbon atoms, k is an integer of 0 to 2, $X^-$ represents an anion represented by the formula $R^{23}C_qF_{2q}SO_3^-$ or $R^{23}SO_3^-$ (wherein $R^{23}$ represents a fluorine atom or a substituted or unsubstituted hydrocarbon group having 1 to 12 carbon atoms, and q is an integer of 1 to 10), or an anion represented by the following formula (9-1) or (9-2), and r is an integer of 1 to 10;

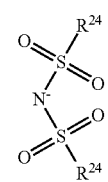

(9-1)

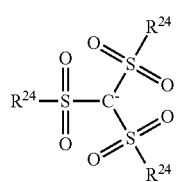

(9-2)

wherein $R^{24}$ individually represents a linear or branched alkyl group having a fluorine atom and 1 to 10 carbon atoms, or two $R^{24}$ groups in combination represent a divalent organic group having a fluorine atom and 2 to 10 carbon atoms, wherein the divalent organic group may have a substituent.

In the formula (8), as examples of the linear or the branched alkyl group having 1 to 10 carbon atoms for $R^{20}$, $R^{21}$, and $R^{22}$, a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like can be given. Of these alkyl groups, a methyl group, an ethyl group, an n-butyl group, a t-butyl group, and the like are preferable.

Examples of the linear or branched alkoxyl group having 1 to 10 carbon atoms represented by $R^{20}$ and $R^{21}$ include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, and an n-decyloxy group. Of these alkoxyl group, a methoxy group, an ethoxy group, an n-propoxy group, and a t-butoxy group are preferable.

Examples of the linear or branched alkoxycarbonyl group having 2 to 11 carbon atoms represented by $R^{20}$ include a methoxycarbonyl group, an ethoxycarbonyl group, an n-propoxycarbonyl group, an i-propoxycarbonyl group, an n-butoxycarbonyl group, a 2-methylpropoxycarbonyl group, an 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, and an n-decyloxycarbonyl group. Of these alkoxycarbonyl groups, a methoxycarbonyl group, an ethoxycarbonyl group, an n-butoxycarbonyl group, and the like are preferable.

As examples of the linear, branched, or cyclic alkanesulfonyl group having 1 to 10 carbon atoms represented by $R^{21}$, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, and a cyclohexanesulfonyl group can be given. Of these alkanesulfonyl groups, a methanesulfonyl group, an ethanesulfonyl group, an n-propanesulfonyl group, an n-butanesulfonyl group, a cyclopentansulfonyl group, and a cyclohexanesulfonyl group are preferable.

r is preferably 0 to 2.

Examples of the substituted or unsubstituted phenyl group represented by $R^{22}$ in the formula (8) include a phenyl group, phenyl groups substituted with a linear, branched, or cyclic alkyl group having 1 to 10 carbon atoms such as an o-tolyl group, an m-tolyl group, a p-tolyl group, a 2,3-dimethylphenyl group, a 2,4-dimethylphenyl group, a 2,5-dimethylphenyl group, a 2,6-dimethylphenyl group, a 3,4-dimethylphenyl group, a 3,5-dimethylphenyl group, a 2,4,6-trimethylphenyl group, a 4-ethylphenyl group, a 4-t-butylphenyl group, 4-cyclohexylphenyl group, and a 4-fluorophenyl group; and groups obtained by substituting the phenyl groups or alkyl-substituted phenyl groups with one or more groups such as a hydroxyl group, a carboxyl group, a cyano group, a nitro group, an alkoxyl group, an alkoxyalkyl group, an alkoxycarbonyl group, and an alkoxycarbonyloxy group.

Examples of the alkoxyl group as the substituent for the phenyl group and alkyl-substituted phenyl group include linear, branched, or cyclic alkoxyl groups having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include linear, branched, or cyclic alkoxyalkyl groups having 2 to 21 carbon atoms such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include linear, branched, or cyclic alkoxycarbonyl groups having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the alkoxycarbonyloxy group include linear, branched, or cyclic alkoxycarbonyloxy groups having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group.

Preferable phenyl groups which may have a substituent represented by $R^{22}$ in the formula (8) are a phenyl group, a 4-cyclohexylphenyl group, a 4-t-butylphenyl group, a 4-methoxyphenyl group, a 4-t-butoxyphenyl group, and the like.

Examples of the substituted or unsubstituted naphthyl group for $R^{22}$ include naphthyl groups such as a 1-naphthyl group, a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group or naptyl groups substituted with a linear, branched, or cyclic alkyl group having 1 to 10 carbon atoms such as a naphthyl group; and groups obtained by further substituting the naphthyl group or alkyl-substituted naphthyl group with at least one and at least one kind of group such as a hydroxyl group, a carboxyl group, a cyano group, a nitro group, an alkoxyl group, an alkoxyalkyl group, an alkoxycarbonyl group, or an alkoxycarbonyloxy group.

As examples of the alkoxyl group, an alkoxyalkyl group, an alkoxycarbonyl group, and an alkoxycarbonyloxy group which are the substituents, the groups illustrated for the phenyl group and alkyl-substituted phenyl groups can be given.

As the naphtyl group which may have a substituent represented by $R^{22}$ in the formula (8), a 1-naphthyl group, a 1-(4-methoxynaphthyl) group, a 1-(4-ethoxynaphthyl) group, a 1-(4-n-propoxynaphtyl) group, a 1-(4-n-butoxynaphthyl) group, a 2-(7-methoxynaphtyl) group, a 2-(7-ethoxynaphtyl) group, a 2-(7-n-propoxynaphtyl) group, a 2-(7-n-butoxynaphtyl) group, and the like are preferable.

As an example of the divalent group having 2 to 10 carbon atoms formed by two $R^{22}$ groups, a group forming a 5 or 6 member ring together with the sulfur atom in the formula (8), particularly preferably a 5 member ring (i.e. tetrahydrothiophene ring) is preferable.

As examples of the substituent for the above divalent groups, the groups previously mentioned for the phenyl group and alkyl-substituted phenyl groups, such as a hydroxyl group, a carboxyl group, a cyano group, a nitro group, an alkoxyl group, an alkoxyalkyl group, an alkoxycarbonyl group, and an alkoxycarbonyloxy group can be given.

As the group $R^{22}$ in the formula (8), a methyl group, an ethyl group, a phenyl group, a 4-methoxyphenyl group, a 1-naphthyl group, and a divalent group having a tetrahydrothiophene cyclic structure formed by two $R^{22}$ groups together with the sulfur atom, and the like are preferable.

$X^-$ in the formula (8) is an anion shown by $R^{23}C_qF_{2q}SO_3^-$, $R^{23}SO_3^-$, or the above formulas (9-1) or (9-2). When $X^-$ is $R^{23}C_qF_{2q}SO_3^-$, the $-C_qF_{2q}-$ group is a linear or branched perfluoroalkylene group having carbon atoms of the number q. q is preferably 1, 2, 4, or 8.

As a hydrocarbon group having 1 to 12 carbon atoms which may have a substituent represented by $R^{23}$, an alkyl group, a cycloalkyl group, and a bridge alicyclic hydrocarbon group having 1 to 12 carbon atoms are preferable.

As specific examples, a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, and an adamantyl group can be given.

When $X^-$ is an anion shown by the formula (9-1) or (9-2), $R^{24}$ individually may represent a linear or branched alkyl group having a fluorine atom and 1 to 10 carbon atoms, or two $R^{24}$ groups in combination may represent a divalent organic group having a fluorine atom and 2 to 10 carbon atoms, wherein the divalent organic group may have a substituent.

A trifluoromethyl group, a pentafluoroethyl group, a heptafuluoropropyl group, a nonafluorobutyl group, a dodecafluoropentyl group, a perfluorooctyl group, and the like can be given as examples of $R^{24}$ when $R^{24}$ in the formula (9-1) or (9-2) is a linear or branched alkyl group having 1 to 10 carbon atoms.

A tetrafluoroethylene group, a hexafluoropropylene group, an octafluorobutylene group, a decafluoropentylene group, an undecafluorohexylene group, and the like can be given as examples of $R^{24}$ when $R^{24}$ is a divalent organic group having 2 to 10 carbon atoms.

Accordingly, preferable examples of the anion $X^-$ in the formula (8) are trifluoromethanesulfonate anion, perfluoro-n-butanesulfonate anion, perfluoro-n-octanesulfonate anion, 2-bicyclo[2.2.1]hept-2-yl-1,1,2,2-tetrafluoroethanesulfonate anion, 2-bicyclo[2.2.1]hept-2-yl-1,1-difluoroethanesulfonate anion, and the anions shown by the following formulas (10-1) to (10-7).

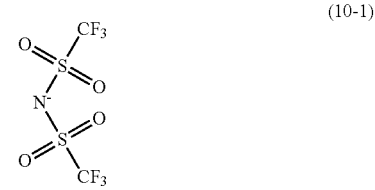

(10-1)

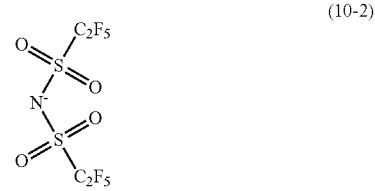

(10-2)

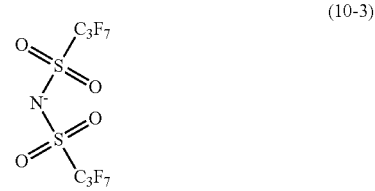

(10-3)

-continued

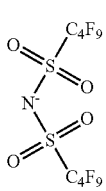
(10-4)

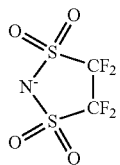
(10-5)

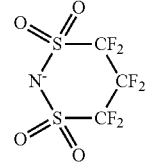
(10-6)

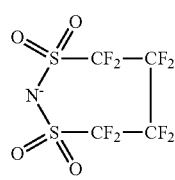
(10-7)

As preferable specific examples of the compound of the formula (8), the following compounds can be given. triphenylsulfonium trifluoromethanesulfonate, tri-t-butylphenylsulfonium trifluoromethanesulfonate, 4-cyclohexylphenyl-diphenylsulfonium trifluoromethanesulfonate, 4-methanesulfonylphenyl-diphenylsulfonium trifluoromethanesulfonate, 1-(3,5-dimethyl-4-hydroxyphenyl)tetrahydrothiophenium trifluoromethanesulfonate, 1-(4-n-butoxynaphthyl)tetrahydrothiophenium trifluoromethanesulfonate, triphenylsulfonium perfluoro-n-butanesulfonate, tri-t-butylphenylsulfonium perfluoro-n-butanesulfonate, 4-cyclohexylphenyl-diphenylsulfonium perfluoro-n-butanesulfonate, 4-methanesulfonylphenyl-diphenylsulfonium perfluoro-n-butanesulfonate, 1-(3,5-dimethyl-4-hydroxyphenyl)tetrahydrothiophenium perfluoro-n-butanesulfonate, 1-(4-n-butoxynaphthyl)tetrahydrothiophenium perfluoro-n-butanesulfonate, triphenylsulfonium perfluoro-n-octanesulfonate, tri-t-butylphenylsulfonium perfluoro-n-octanesulfonate, 4-cyclohexylphenyl-diphenylsulfonium perfluoro-n-octanesulfonate, 4-methanesulfonylphenyl-diphenylsulfonium perfluoro-n-octanesulfonate, 1-(3,5-dimethyl-4-hydroxyphenyl)tetrahydrothiophenium perfluoro-n-octanesulfonate, 1-(4-n-butoxynaphthyl)tetrahydrothiophenium perfluoro-n-octanesulfonate, triphenylsulfonium 2-(bicyclo[2.2.1]hept-2'-yl)-1,1,2,2-tetrafluoroethanesulfonate, tri-tert-butylphenylsulfonium 2-(bicyclo[2.2.1]hept-2'-yl)-1,1,2,2-tetrafluoroethanesulfonate, 4-cyclohexylphenyldiphenylsulfonium 2-(bicyclo[2.2.1]hept-2'-yl)-1,1,2,2-tetrafluoroethanesulfonate, 4-methanesulfonyl-diphenylsulfonium 2-(bicyclo[2.2.1]hept-2'-yl)-1,1,2,2-tetrafluoroethanesulfonate, 1-(3,5-dimethyl-4-hydroxyphenyl)tetrahydrothiophenium 2-(bicyclo[2.2.1]hept-2'-yl)-1,1,2,2-tetrafluoroethanesulfonate, 1-(4-n-butoxynaphthyl)tetrahydrothiophenium 2-(bicyclo[2.2.1]hept-2'-yl)-1,1,2,2-tetrafluoroethanesulfonate, triphenylsulfonium 2-(bicyclo[2.2.1]hept-2'-yl)-1,1-difluoroethanesulfonate, tri-tert-butylphenylsulfonium 2-(bicyclo[2.2.1]hept-2'-yl)-1,1-difluoroethanesulfonate, 4-cyclohexylphenyl diphenylsulfonium 2-(bicyclo[2.2.1]hept-2'-yl)-1,1-difluoro ethanesulfonate, 4-methane sulfonylphenyl-diphenylsulfonium 2-(bicyclo[2.2.1]hept-2'-yl)-1,1-difluoro ethanesulfonate, 1-(3,5-dimethyl-4-hydroxyphenyl)tetrahydrothiophenium 2-(bicyclo[2.2.1]hept-2'-yl)-1,1-difluoro ethanesulfonate, 1-(4-n-butoxynaphthyl)tetrahydrothiophenium 2-bicyclo[2.2.1]hept-2'-yl-1,1-difluoroethanesulfonate, and compounds shown by the following formulas (C1) to (C15).

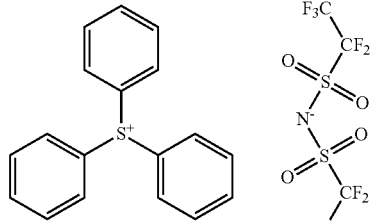
(C1)

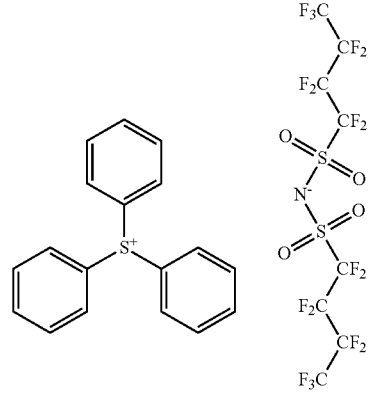
(C2)

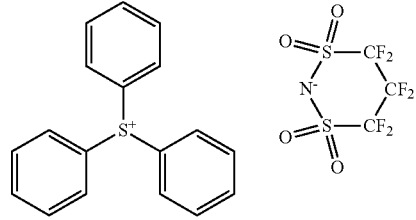
(C3)

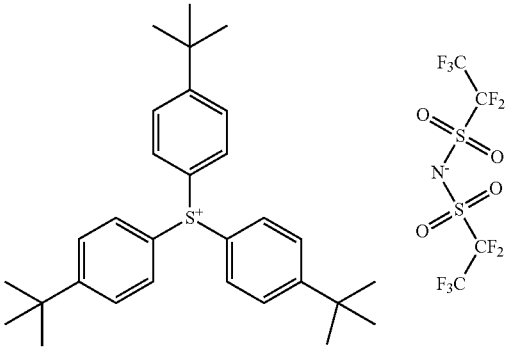
(C4)

(C5)
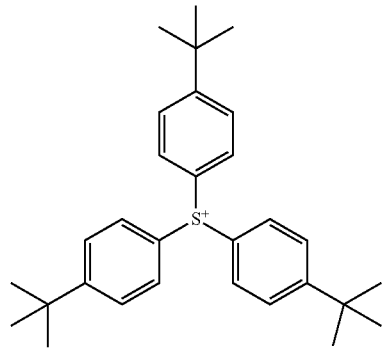
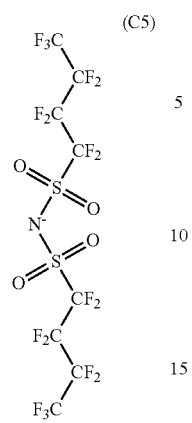
(C6)
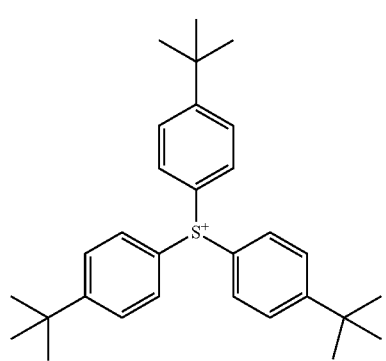
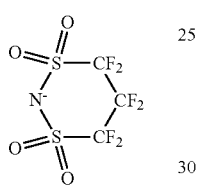
(C7)
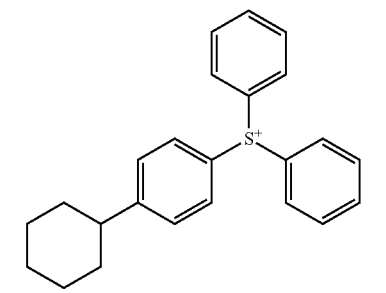
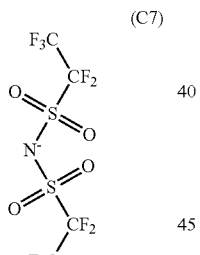
(C8)
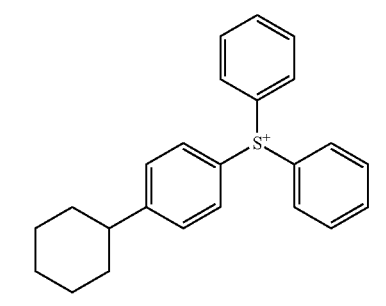
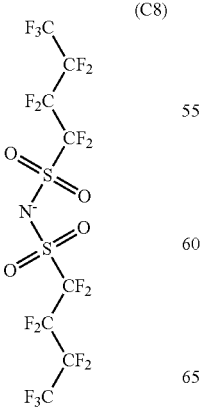
(C9)
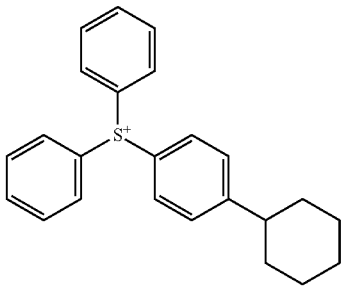
(C10)
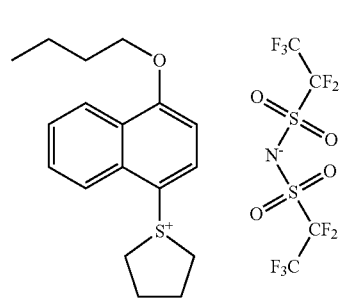
(C11)
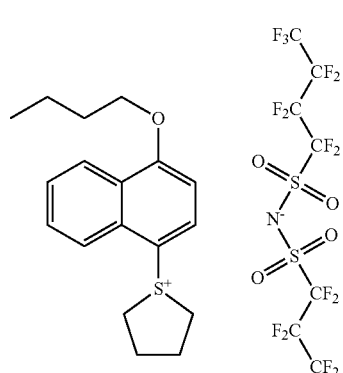
(C12)
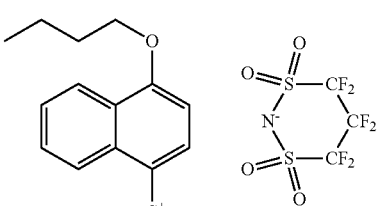
(C13)
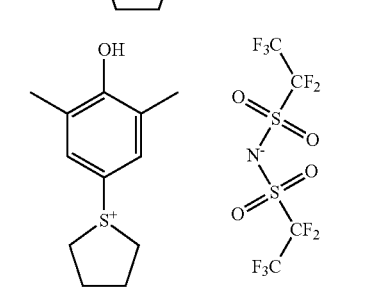

-continued (C14)
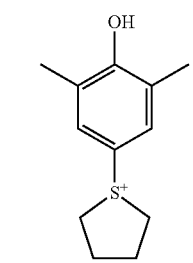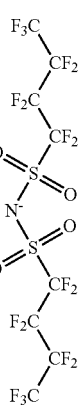

(C15)
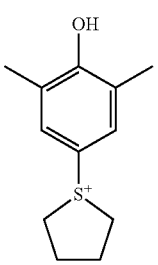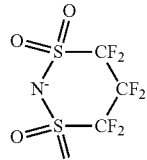

The above-described acid generator 1 may be used either individually or in combinations of two or more.

As examples of the radiation-sensitive acid generators other than the acid generator 1 (hereinafter referred to as "other acid generator"), onium salts, halogen-containing compounds, diazoketone compounds, sulfone compounds, and sulfonate compounds can be given. Examples of the other acid generators are given below.

Onium Salt Compounds:

As examples of the onium salt compounds, an iodonium salt, a sulfonium salt, a phosphonium salt, a diazonium salt, and a pyridinium salt can be given.

As specific examples of the onium salt compounds, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, and the like can be given.

Halogen-Containing Compounds:

As examples of the halogen-containing compound, haloalkyl group-containing hydrocarbon compounds and haloalkyl group-containing heterocyclic compounds can be given.

As specific examples of the halogen-containing compound, (trichloromethyl)-s-triazine derivatives such as phenylbis(trichloromethyl)-s-triazine, 4-methoxyphenylbis(trichloromethyl)-s-triazine, 1-naphthylbis(trichloromethyl)-s-triazine, and 1,1-bis(4-chlorophenyl)-2,2,2-trichloroethane can be given.

Diazoketone Compound:

As examples of the diazoketone compound, 1,3-diketo-2-diazo compounds, diazobenzoquinone compounds, and diazonaphthoquinone compounds can be given.

As specific examples of the diazoketone compound, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4-hydroxyphenyl)ethane can be given.

Sulfone Compounds:

As examples of the sulfone compound, β-ketosulfone, β-sulfonylsulfone, and α-diazo compounds of these compounds can be given.

As specific examples of the sulfone compound, 4-trisphenacylsulfone, mesitylphenacylsulfone, bis(phenylsulfonyl)methane, and the like can be given.

Sulfonic Acid Compounds:

As examples of the sulfonic acid compound, alkyl sulfonates, alkyl sulfonylimides, haloalkyl sulfonates, aryl sulfonates, and imino sulfonates can be given.

As specific examples of the sulfone compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hept-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like can be given.

Among these other acid generators, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hepta-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hepta-2-yl-1,1,2,2-tetrafluoroethanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hept-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, 1,8-naphthalenedicarboxylic acid imide trifluoromethanesulfonate, and the like are preferable.

These other acid generators may be used either individually or in combination of two or more.

The amount of the acid generator 1 and the other acid generators to be used in the embodiment of the present invention is usually 0.1 to 20 parts by mass, and preferably 0.5 to 10 parts by mass for 100 parts by mass of the resin (A) from the viewpoint of ensuring sensitivity and developability as a resist. If this total amount is less than 0.1 part by mass, the sensitivity and developability as a resist tend to be impaired. If this total amount is more than 20 parts by mass, the transparency of the resist to radiation tends to decrease, which makes it difficult to obtain a rectangular resist pattern.

The proportion of the other acid generators to be added is 80 mass % or less, and preferably 60 mass % or less of the total amount of acid generators (acid generator 1 and other acid generators) used.

<Solvent (D)>

Examples of the "solvent (D)" contained in the first resist layer forming resin composition include linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone;

cyclic ketones such as cyclopentanone, 3-methylcyclopentanone, cyclohexanone, 2-methylcyclohexanone, 2,6-dimethylcyclohexanone, and isophorone;

propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate;

alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate;

alkyl 3-alkoxypropionates such as methyl 3-methoxypropionate, ethyl 3-methoxypropionate, methyl 3-ethoxypropionate, and ethyl 3-ethoxypropionate;

n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate.

Among these, linear or branched ketones, cyclic ketones, propylene glycol monoalkyl ether acetates, alkyl 2-hydroxypropionates, alkyl 3-alkoxypropionates, γ-butyrolactone, and the like are preferable.

These solvents (D) may be used either individually or in combinations of two or more.

The first resist layer forming resin composition of the embodiment of the present invention is usually used in the form of a composition solution prepared by dissolving the composition in the solvent (D) so that the total solid content is usually 1 to 50 mass %, and preferably 1 to 25 mass %, and filtering the solution using a filter with a pore diameter of about 0.2 μm, for example.

<Additives>

Various additives such as an acid diffusion controller, an aliphatic additive, a surfactant, and a sensitizer can be optionally added to the first resist layer forming resin composition of the embodiment of the present invention.

The acid diffusion controller controls diffusion of an acid generated from the acid generator upon exposure in the resist film to suppress undesired chemical reactions in the unexposed area. Addition of such an acid diffusion controller improves storage stability of the resulting first resist layer forming resin composition. Moreover, the addition of the acid diffusion controller further increases resolution as a resist and suppresses change of the resist pattern line width due to fluctuation of post-exposure delay (PED) which is a period of time from exposure to post-exposure heat treatment, whereby a composition with remarkably superior process stability can be obtained.

As examples of the acid diffusion controller, tertiary amine compounds, other amine compounds, amide group-containing compounds, urea compounds, and other nitrogen-containing heterocyclic compounds can be given.

As tertiary amine compounds, mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; substitute alkylamines such as 2,2',2"-nitrotriethanol; aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, 2,6-diisopropylaniline, and the like are preferable.

Preferable examples of the above-mentioned other amine compounds include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, and N,N,N',N'',N''-pentamethyldiethylenetriamine As examples of the preferable amide group-containing compounds, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(–)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N-t-butoxycarbonylpiperidine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like can be given.

As examples of the preferable urea compounds, urea, methylurea, 1,1-dimethylurea, 1,3-dimethylurea, 1,1,3,3-tetramethylurea, 1,3-diphenylurea, and tri-n-butylthiourea can be given.

Examples of the preferable other nitrogen-containing heterocyclic compounds include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; and pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, and 1,4-diazabicyclo[2.2.2]octane.

(Photodisintegrating Base)

The photodisintegrating base is an onium salt compound which generates a base exhibiting an acid diffusion controlling effect by decomposing upon exposure to radiation. As specific examples of the onium salt compound, the sulfonium salt compound shown by the following formula (11) and the iodonium salt compound shown by the following formula (12) can be given,

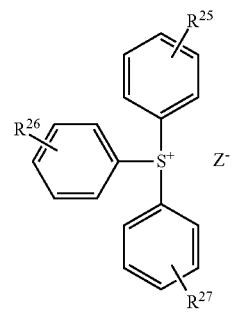

(11)

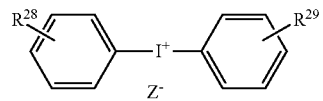

(12)

wherein $R^{25}$ to $R^{29}$ individually represent a hydrogen atom, an alkyl group, an alkoxyl group, a hydroxyl group, or a halogen atom and $Z^-$ represents $OH^-$, $RCOO^-$, $RSO_3^-$ (wherein R represents an alkyl group, an aryl group, or an alkaryl group), or an anion shown by the following formula (13).

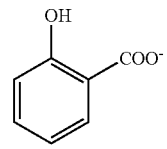

(13)

As specific examples of the sulfonium salt compound and iodonium salt compound, triphenylsulfonium hydrooxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, and 4-t-butoxyphenyl diphenylsulfonium 10-camphorsulfonate can be given.

These acid diffusion controllers may be used either individually or in combinations of two or more.

The amount of acid diffusion controller to be added is preferably 0.001 to 15 parts by mass, more preferably 0.01 to 10 parts by mass, and still more preferably 0.05 to 5 parts by mass for 100 parts by mass of the resin (A). If the amount of the acid diffusion controllers exceeds 15 parts by mass, sensitivity as a resist may decrease. If the amount is less than 0.001 part by mass, the pattern configuration or dimensional accuracy as a resist may decrease depending on the processing conditions.

The alicyclic additives further improve dry etching tolerance, pattern shape, and adhesion to substrate.

As examples of such alicyclic additives, adamantane derivatives such as 1-adamantanecarboxylic acid, 2-adamantanone, t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[4.4.0.1$^{2,5}$.1$^{7,10}$]dodecane can be given. These alicyclic additives may be used either individually or in combination of two or more.

Surfactants improve applicability, striation, developability, and the like.

As the surfactants, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by Dainippon Ink and Chemicals, Inc.), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like can be given. These surfactants may be used either individually or in combination of two or more.

The sensitizers absorb radiation energy and transmit the energy to the acid generator, thereby increasing the amount of an acid to be generated upon exposure. The sensitizers improve apparent sensitivity of the resin composition.

As examples of the sensitizer, carbazoles, acetophenones, benzophenones, naphthalenes, phenols, biacetyl, eosine, rose bengal, pyrenes, anthracenes, phenothiazines, and the like can be given. These sensitizers may be used either individually or in combination of two or more.

As other additives, an alkali-soluble resin, low molecular weight alkali solubility controllers containing acid dissociable protecting group, halation inhibitors, preservation stabilizers, antifoaming agents, and the like can be given. Addition of a dye or a pigment visualizes a latent image in the exposed area, thereby decreasing the effects of halation during exposure. Use of an adhesion improver improves adhesion to the substrates.

[3] Positive-Working Radiation-Sensitive Resin Composition for Forming Second Resist Layer A resin composition including (a) a resin which becomes alkali-soluble by the action of an acid and (b) a solvent is used for forming the second resist layer in the resist pattern forming method of the embodiment of the present invention.

<Resin (a) which Becomes Alkali-Soluble by Action of Acid>

The resin (a) which becomes alkali-soluble by action of acid is a resin insoluble or scarcely soluble in alkali, but becomes alkali-soluble by the action of an acid. The term "alkali-insoluble" or "scarcely alkali-soluble" refers to properties in which 50% or more of the initial thickness of the resist film remains after development, in the case of developing a film using only the resin (a) instead of a resist film under alkaline development conditions employed when forming a resist pattern of the resist film formed from the second resist layer forming resin composition containing the resin (a).

Although any resins which becomes soluble in alkali by the action of an acid can be used as the resin (a) without a particular limitation, a resin containing a repeating unit shown by the formula (14) (hereinafter referred to from time to time as "repeating unit (14)") and a repeating unit having a skeleton shown by the above-mentioned formula (3) which becomes soluble in alkali by the action of an acid is preferable when a positive-working radiation-sensitive composition containing the crosslinking agent (A) is used. There no particular limitations when a positive-working radiation-sensitive composition in which the polymer (B2) having a crosslinking group and an acid-unstable group is used.

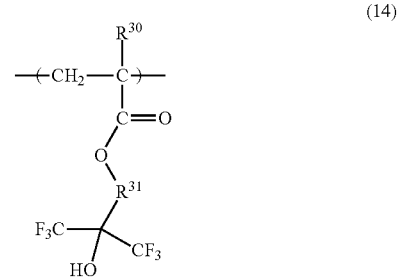

(14)

wherein $R^{30}$ represents a hydrogen atom, a methyl group, or a trifluoromethyl group, and $R^{31}$ represents a single bond, a methylene group, a linear or branched alkylene group having 2 to 6 carbon atoms, or an alicyclic alkylene group having 4 to 12 carbon atoms.

$R^{31}$ in the formula (14), which represents a single bond, a methylene group, a linear or branched alkylene group having 2 to 6 carbon atoms, or an alicyclic alkylene group having 4 to 12 carbon atoms, may be an alkylene glycol group or an alkylene ester group.

As preferable examples of $R^{31}$, saturated chain hydrocarbon groups such as a methylene group, an ethylene group, a propylene group (e.g., a 1,3-propylene group, a 1,2-propylene group), a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; monocyclic hydrocarbon groups such as cyclobutylene groups (e.g., a 1,3-cyclobutylene group), cyclopentylene groups (e.g., a 1,3-cyclopentylene group), cyclohexylene groups (e.g., 1,4-cyclohexylene group), and cyclooctylene groups (e.g., 1,5-cyclooctylene group); bridged cyclic hydrocarbon groups such as cyclic hydrocarbon groups with 2 to 4 rings having 4 to 12 carbon atoms such as norbornylene groups (e.g., 1,4-norbornylene group, 2,5-norbornylene group), and admantylene groups (e.g., 1,5-admantylene group, 2,6-admantylene group); and the like can be given.

Among these, a hydrocarbon group having a 2,5-norbornylene group, a 1,2-ethylene group, and a propylene group are preferable as $R^{31}$.

When the $R^{31}$ includes a divalent alicyclic hydrocarbon group, it is preferable to insert an alkylene group having 1 to 4 carbon atoms as a spacer between the bis(trifluoromethyl)hydroxymethyl group and the alicyclic hydrocarbon group.

As preferable examples of the monomer providing the repeating unit (14), (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-{[5-(1',1,1'-trifluoro-2'-trifluoromethyl-2'-hydroxy)propyl]bicyclo[2.2.1]heptyl}(meth)acrylate, 3-{[8-(1',1',1'-trifluoro-2'-trifluoromethyl-2'-hydroxy)propyl]tetracyclo[6.2.1.1$^{3,6}$.0$^{2,7}$]dodec yl}(meth)acrylate, and the like can be given.

The resin (a) may contain only one type of repeating unit (14) or two or more types of repeating units (14).

The resin (a) used in the second resist layer forming resin composition may include repeating units other than the above-mentioned repeating unit (14) or the repeating unit (3).

As examples of the other repeating units, the above-mentioned repeating units (4-1) to (7), the repeating unit (15), and the like which are used in the first resist layer forming resin composition can be given.

The content of the repeating unit (14) in the resin (a) for the second resist layer forming resin composition is preferably 30 to 90 mol %, more preferably 30 to 80 mol %, and still more preferably 40 to 80 mol % for 100 mol % of all the repeating units contained in the resin (a). If the content of the repeating unit (14) is less than 30 mol %, solubility of the resin in the alcoholic solvent may decrease. If more than 90 mol %, resolution of the resist film may decrease.

The content of the repeating unit (3) is preferably 10 to 70 mol %, more preferably 10 to 60 mol %, and still more preferably 20 to 60 mol % for 100 mol % of all the repeating units in the resin (a). If the content of the repeating unit (3) is less than 10 mol %, resolution as a resist may decrease. If more than 70 mol %, the developability of the resist film may decrease.

The content of the repeating units (4-1) to (4-6) is preferably not more than 50 mol %, more preferably not more than 40 mol %, and still more preferably not more than 35 mol % for 100 mol % of all the repeating units in the resin (a). If the content of the repeating units (4-1) to (4-6) exceeds 50 mol %, solubility in alcohol solvents may decrease.

The content of the repeating unit (5) is preferably not more than 30 mol %, and more preferably not more than 25 mol % of 100 mol % of all the repeating units contained in the resin (a). If the content of the repeating unit (5) is more than 30 mol %, the resist film produced tends to swell in an alkali developer and solubility in an alkali developer may decrease.

The content of the repeating unit (6) is preferably not more than 30 mol %, and more preferably not more than 25 mol % of 100 mol % of all the repeating units contained in the resin (a). If the content of the repeating unit (6) is more than 30 mol %, the resist film produced tends to swell in an alkali developer and solubility in an alkali developer may decrease.

The content of the repeating unit (7) is preferably not more than 30 mol %, and more preferably not more than 25 mol % of 100 mol % of all the repeating units contained in the resin (a). If the content of the repeating unit (7) is more than 30 mol %, the resist film produced tends to swell in an alkali developer and solubility in an alkali developer may decrease.

The content of the repeating unit (15) is preferably not more than 30 mol %, and more preferably not more than 25 mol % of 100 mol % of all the repeating units contained in the resin (a). If the content of the repeating unit (15) is more than 30 mol %, the resist film produced tends to swell in an alkali developer and solubility in an alkali developer may decrease.

The amount of the other repeating units (the total of other than the repeating unit (14) and repeating unit (3)) is preferably not more than 50 mol %, and more preferably not more than 40 mol % of the total amount of the all the repeating units in the resin (a).

The second resist layer forming resin composition may contain only one type of the resin (a) or may contain two or more of types of the resin (a).

The resin (a) can be prepared by, for example, polymerizing polymerizable unsaturated monomers for constituting each of the above repeating units in the same manner as in the preparation of the resin (A) mentioned above.

Although not particularly limited, the polystyrene-reduced weight average molecular weight (hereinafter referred to from time to time as "Mw") of the resin (a) determined by gel permeation chromatography (GPC) is preferably 1000 to 100,000, more preferably 1000 to 30,000, and still more preferably 1000 to 20,000. If the Mw of the resin (a) is less than 1000, the heat resistance of the resist film may decrease. If the Mw of the resin is more than 100,000, the developability of the resist film may decrease. The ratio of Mw to the polystyrene-reduced number average molecular weight (hereinafter referred to time to time as "Mn") determined by GPC (Mw/Mn) of the resin (a) is usually 1 to 5, and preferably 1 to 3.

The resin (a) may contain low molecular weight components originating from the monomers used when preparing the resin. The amount of the low molecular weight components in the resin (a) is preferably not more than 0.1 mass %, more preferably not more than 0.07 mass %, and still more preferably not more than 0.05 mass % for 100 mass % (reduced to solid components) of the resin (a). When this content is not more than 0.1 mass %, the amount of elusion in the liquid for liquid immersion lithography such as water with which the resist film comes in contact during exposure can be reduced. In addition, it is possible to prevent generation of extraneous substances in the resist during storage, inhibit uneven resist application, and sufficiently suppress production of defects during pattern formation.

It is preferable that the resin (a) contain only a small amount of impurities such as halogens and metals. The sensitivity, resolution, process stability, pattern shape, and the like of formed resist film can be improved by reducing such impurities.

The following methods can be given as methods for purifying the resin (a).

<Solvent (b)>

As the solvent (b), a solvent not dissolving the first resist pattern which is formed in the resist pattern forming method of the embodiment of the present invention is preferably used when the positive-working radiation-sensitive resin composition containing the crosslinking agent (A) is used. That is, it is desirable to select the solvent which is mixed with the first resist pattern only with difficulty. There is no particular limitations when a positive-working radiation-sensitive composition in which the polymer (B2) having a crosslinking group and an acid-unstable group is used.

As the solvent (b) which is mixed with the first resist pattern only with difficulty, alcohol solvents are preferable. The alcoholic solvent refers to (1) a solvent consisting of an alcohol solvent or (2) a solvent consisting of an alcohol solvent and other solvent.

As examples of the alcohol solvent, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol can be given.

Examples of the other solvents include diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, dihexyl ether, dioctyl ether, cyclopentyl methyl ether, cyclohexyl methyl ether, cyclododecyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, cyclohexyl-tert-butyl ether, bromomethyl methyl ether, iodomethyl methyl ether, α,α-dichloromethyl methyl ether, chloromethyl ethyl ether, 2-chloroethyl methyl ether, 2-bromoethyl methyl ether, 2,2-dichloro ethyl methyl ether, 2-chloroethyl ethyl ether, 2-bromoethyl ethyl ether, (±)-1,2-dichloroethyl ethyl ether, di-2-bromoethyl ether, 2,2,2-trifluoroethyl ether, chloromethyl octyl ether, bromomethyl octyl ether, di-2-chloroethyl ether, ethyl vinyl ether, butyl vinyl ether, allylethyl ether, allyl propyl ether, allyl butyl ether, diallyl ether, 2-methoxypropene, ethyl-1-propenyl ether, 1-methoxy-1,3-butadiene, cis-1-bromo-2-ethoxyethylene, 2-chloroethyl vinyl ether, and allyl-1,1,2,2-tetrafluoro ethyl ether.

Among these, preferable ethers are dipropyl ether, diisopropyl ether, butyl methyl ether, butyl ethyl ether, butyl propyl ether, dibutyl ether, diisobutyl ether, tert-butyl-methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, and cyclohexyl-tert-butyl ether. In addition, octane, isooctane, nonane, decane, methylcyclohexane, decalin, xylene, amyl benzene, ethylbenzene diethyl benzene, cumene, sec-butylbenzene, cymene, and a dipentene are preferable.

When the solvent (b) contains the other solvents, the proportion of the other solvents is usually 60 mass % or less, preferably 50 mass % or less, and still more preferably 40 mass % or less of 100 mass % of the solvent (b).

These solvents (b) may be used either individually or in combinations of two or more.

The second resist layer forming resin composition is usually used in the form of a composition solution prepared by dissolving the composition in the solvent (b) so that the total solid content is usually 1 to 50 mass %, and preferably 1 to 25 mass %, and thereafter filtering the solution using a filter with a pore diameter of about 0.2 μm, for example.

<Radiation-Sensitive Acid Generator>

A radiation-sensitive acid generator is usually added to the second resist layer forming resin composition.

The above description concerning the acid generator in the first resist layer forming resin composition can be applied as is to the acid generator. The acid generator added to the first resist layer forming resin composition and the second resist layer forming resin composition may be either the same or different.

The total amount of the acid generator 1 and aforementioned other acid generators is usually 0.1 to 20 parts by mass, and preferably 0.5 to 10 parts by mass for 100 parts by mass of the resin (a) from the viewpoint of ensuring sensitivity and developability as a resist. If this total amount is less than 0.1 part by mass, the sensitivity and developability tend to be impaired. If this total amount is more than 20 parts by mass, the transparency of the resist to radiation tends to decrease, which makes it difficult to obtain a rectangular resist pattern.

The proportion of the other acid generators to be added is 80 mass % or less, and preferably 60 mass % or less of the total amount of 100 mass % of acid generators (acid generator 1 and other acid generators) used.

<Additives>

Additives may be added to the second resist layer forming resin composition. The above description of various additives used in the first resist layer forming resin composition such as acid diffusion controller can be applied as is to the each kinds of additives.

When the acid diffusion controller is added, the amount of the acid diffusion controller is preferably 0.001 to 15 parts by mass, more preferably 0.01 to 10 parts by mass, and still more preferably 0.05 to 5 parts by mass for 100 parts by mass of the resin (a). If the amount of the acid diffusion controllers exceeds 15 parts by mass, sensitivity as a resist may decrease. If the amount is less than 0.001 parts by mass, the pattern configuration or dimensional accuracy as a resist may decrease depending on the processing conditions.

EXAMPLES

Embodiments of the present invention are described below in detail by examples. However, these examples should not be construed as limiting the present invention. In the examples, "part" refers to "part by mass" unless otherwise indicated.

Case in which Positive-Working Radiation-Sensitive Composition Containing Crosslinking Agent (A) is Used Example 1

Preparation of First Resist Layer Forming Radiation-Sensitive Resin Composition 15 parts by mass of 1,3,5-triallyl-1,3,5-triazine-2,4,6(1H,3H,5H)-trione as the crosslinking agent (A), 3.0 parts by mass of triphenylsulfonium nonafluoro-n-butanesulfonate as the radiation-sensitive acid generator (C), 0.34 parts by mass of N-t-butoxycarbonylpyrrolidine as the acid diffusion controller (D), 960 parts by mass of cyclohexanone as a main solvent, and 410 parts by mass of propylene glycol monomethyl ether acetate as a subsolvent were added to 100 parts by mass of the polymer of the following formula (B-1) as the resin (B). These components were mixed to obtain a homogeneous solution. The solution was filtered through a membrane filter with a pore diameter of 200 nm to obtain a coating solution of a radiation-sensitive resin composition (total solid content: about 7 mass %).

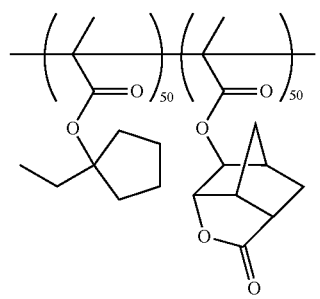

(B-1)

Comparative Example 1

Preparation of First Resist Layer Forming Radiation-Sensitive Resin Composition 3.0 parts by mass of triphenylsulfonium nonafluoro-n-butanesulfonate as the radiation-sensitive acid generator (C), 0.34 parts by mass of N-t-butoxycarbonylpyrrolidine as the acid diffusion controller (D), 960 parts by mass of cyclohexanone as a main solvent, and 410 parts by mass of propylene glycol monomethyl ether acetate as a subsolvent were added to 100 parts by mass of the polymer of the above formula (B-1) as the resin (B). These components were mixed to obtain a homogeneous solution. The solution was filtered through a membrane filter with a pore diameter of 200 nm to obtain a coating solution of a radiation-sensitive resin composition (total solid content: about 7 mass %).

Measurement and evaluation of the resulting radiation-sensitive resin compositions were carried out according to the following procedures.

(1) Measurement of Characteristic Curve:

Using a CLEAN TRACK ACT8 (manufactured by Tokyo Electron, Ltd.), the radiation-sensitive resin composition was spin-coated on a silicon substrate and baked (PB) at 80° C. for 60 seconds to obtain a resist film with a thickness of 150 nm. The resist film was exposed to radiation through quartz not having a pattern using an ArF excimer laser exposure apparatus ("NSR S306C" manufactured by Nicon Corp., exposure conditions: NA 0.75 sigma 0.85). After PEB at 130° C. for 60 seconds, the resist coating was developed at 23° C. for 30 seconds in a 2.38 mass % tetramethylammonium hydroxide aqueous solution, washed with water, and dried to obtain a wafer for measuring a characteristic curve. The film thickness was measured at various exposure doses using an automatic thickness meter ("VM-2010" manufactured by Dainippon Screen Mfg. Co., Ltd.) to confirm the correlation between the exposure dose and the film thickness. The results are shown in FIG. 4.

As clear from the characteristic curve measurement shown in FIG. 4, the radiation sensitive resin composition for liquid immersion lithography of the embodiment of the present invention was confirmed to function as a positive-working resist and a negative-working resist responding to a certain amount of radiation at 193 nm. Specifically, the resin composition can form a positive-working resist pattern at a low exposure dose, of which the pattern is converted into negative-working at a dose of several times the optimum dose and can be expected to be inactivated when forming a second resist pattern. In the resist pattern forming method proposed by the present invention in which this resin composition is used, it is possible to make the first resist pattern inactive when the second resist pattern is formed by exposing the first resist pattern to radiation at a dose several times the optimum dose for forming the first resist pattern and heating the exposed resist pattern, whereby it is possible to form a desired pattern.

Case in which Positive-Working Radiation-Sensitive Composition Using Polymer (B2) Having Crosslinking Group and Acid-Unstable Group is Used

Examples 2 to 13

Preparation of First Resist Layer Forming Radiation-Sensitive Compositions 7.5 parts by mass of triphenylsulfonium nonafluoro-n-butanesulfonate (C-1) as the radiation-sensitive acid generator (C), 0.94 parts by mass of N-t-butoxycarbonylpyrrolidine (D-1) as the acid diffusion controller (D), 1287 parts by mass of propylene glycol monomethyl ether acetate (E-1) as a main solvent, and 551 parts by mass of cyclohexanone (E-2) as a subsolvent were added to a mixture of 80 parts by mass of the polymer of the following formula (B-2) and 20 parts by mass of one of the following polymers (B-3) to (B-6) or (B-11) to (B-14) or 100 parts by mass of one of the following polymers (B-7) to (B-10), as the resin (B). These components were mixed to obtain homogeneous solutions. The solutions were filtered through a membrane filter with a pore diameter of 200 nm to obtain the radiation-sensitive composition coating solutions (total solid content: about 7 mass %) shown in Table 1.

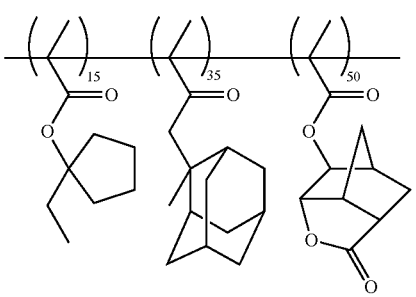

B-2

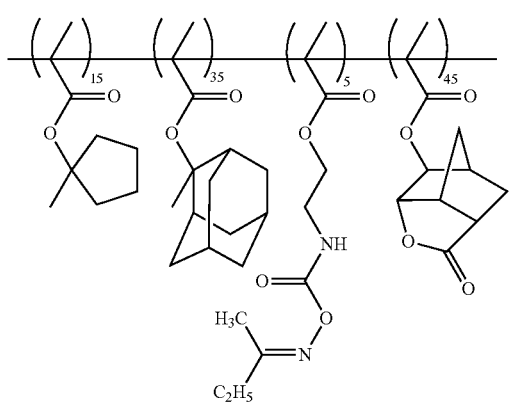

B-3

B-4
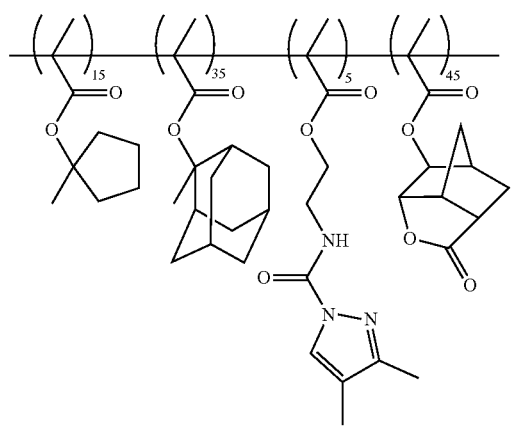
B-5
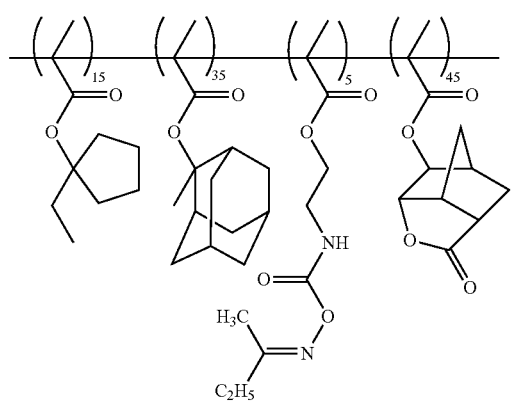
B-6
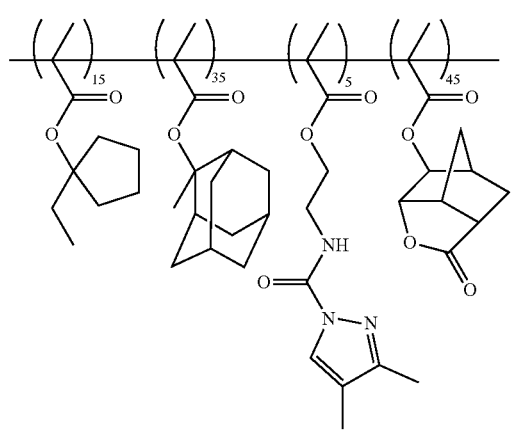
B-7
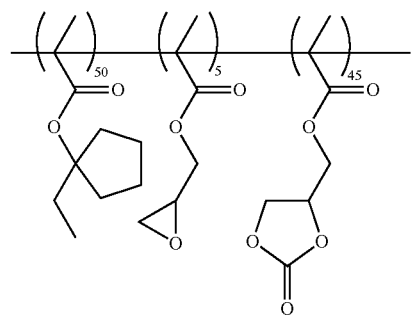
B-8
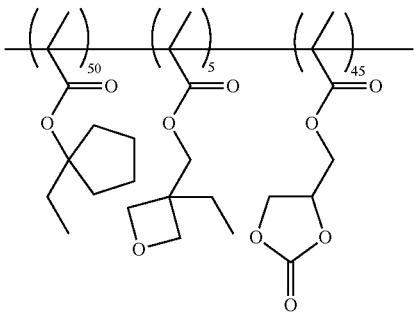
B-9
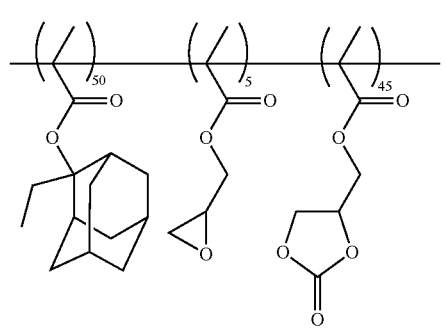
B-10
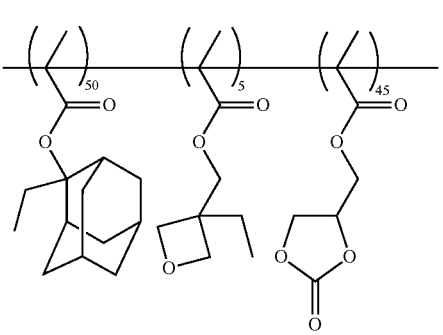
B-11
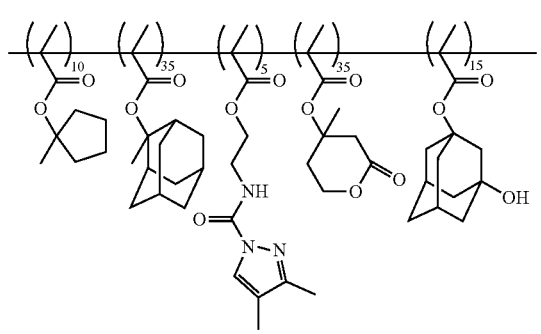
B-12
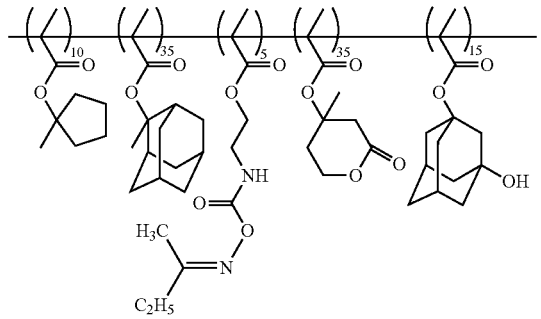

-continued

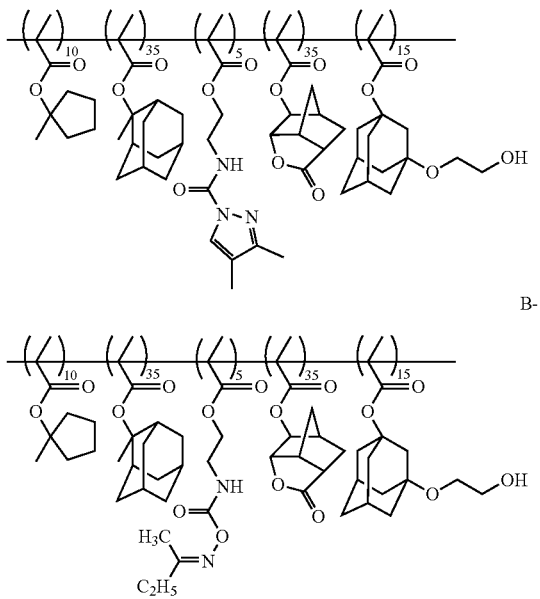

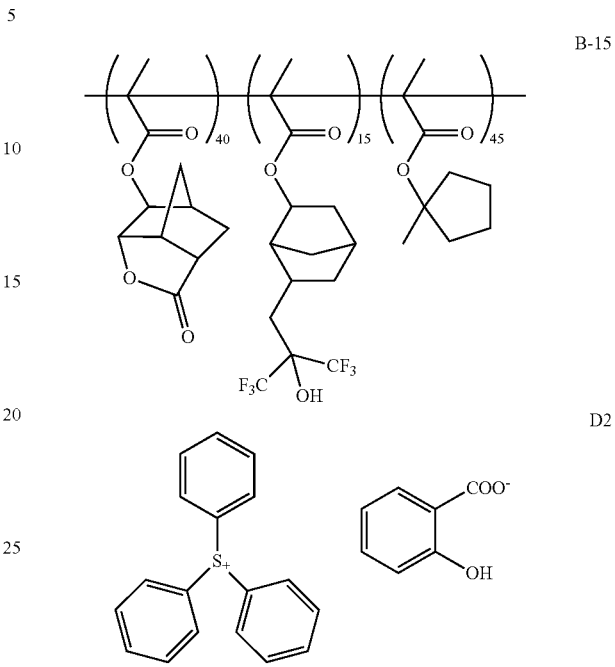

filter with a pore diameter of 200 nm to obtain radiation-sensitive composition coating solutions (total solid content: about 6.5 mass %).

TABLE 1

| | Polymer (B) (part) | Polymer (B) (part) | Acid generator (C) (part) | Nitrogen-containing compound (D) (part) | Solvent (E) (part) |
|---|---|---|---|---|---|
| Example 2 | B-2 (80) | B-3 (20) | C-1 (7.5) | D-1 (0.94) | E-1 (1287) E-2 (551) |
| Example 3 | B-2 (80) | B-4 (20) | C-1 (7.5) | D-1 (0.94) | E-1 (1287) E-2 (551) |
| Example 4 | B-2 (80) | B-5 (20) | C-1 (7.5) | D-1 (0.94) | E-1 (1287) E-2 (551) |
| Example 5 | B-2 (80) | B-6 (20) | C-1 (7.5) | D-1 (0.94) | E-1 (1287) E-2 (551) |
| Example 6 | — | B-7 (100) | C-1 (7.5) | D-1 (0.94) | E-1 (1287) E-2 (551) |
| Example 7 | — | B-8 (100) | C-1 (7.5) | D-1 (0.94) | E-1 (1287) E-2 (551) |
| Example 8 | — | B-9 (100) | C-1 (7.5) | D-1 (0.94) | E-1 (1287) E-2 (551) |
| Example 9 | — | B-10 (100) | C-1 (7.5) | D-1 (0.94) | E-1 (1287) E-2 (551) |
| Example 10 | B-2 (80) | B-11 (20) | C-1 (7.5) | D-1 (0.94) | E-1 (1287) E-2 (551) |
| Example 11 | B-2 (80) | B-12 (20) | C-1 (7.5) | D-1 (0.94) | E-1 (1287) E-2 (551) |
| Example 12 | B-2 (80) | B-13 (20) | C-1 (7.5) | D-1 (0.94) | E-1 (1287) E-2 (551) |
| Example 13 | B-2 (80) | B-14 (20) | C-1 (7.5) | D-1 (0.94) | E-1 (1287) E-2 (551) |
| Comparative Example 1 | B-1 (100) | — | C-1 (7.5) | D-1 (0.94) | E-1 (1287) E-2 (551) |

Preparation of Second Resist Layer Forming Radiation-Sensitive Resin Composition 7.0 parts by mass of triphenylsulfonium nonafluoro-n-butanesulfonate as the radiation-sensitive acid generator (C), 2.64 parts by mass of the compound shown by the following formula (D2) as the acid diffusion controller (D), and 2014 parts by mass of propylene glycol monomethyl ether acetate as a main solvent were added to 100 parts by mass of the polymer of the following formula (B-15) as the resin (a). These components were mixed to obtain a homogeneous solution. The solutions were filtered through a membrane filter with a pore diameter of 200 nm to obtain radiation-sensitive composition coating solutions (total solid content: about 6.5 mass %).

(1) Double Patterning (DP) Formation and Evaluation

Double patterns were formed from the first resist and second resist according to the following steps (i) to (iii). (i) First resist pattern formation, (ii) baking at 200° C. for 90 seconds, (iii) second resist pattern formation (i) A coated film with a thickness of 77 nm was formed on an 8 inch silicon wafer by spin coating a lower layer antireflection film ("ARC29A" manufactured by Brewer Science) using a "CLEAN TRACK ACT8" (manufactured by Tokyo Electron Ltd.) and baking (PB, 205° C., 60 seconds). The first resist agent was spin coated using the "CLEAN TRACK ACT8", baked (PB, 130° C., 60 seconds), and cooled (23° C., 30 seconds) to obtain a coated film with a thickness of 150 nm. Next, the film was exposed to radiation using an ArF exposure apparatus ("S306C" manufactured by NIKON) under the optical conditions of NA: 0.78 and outer/inner=⅔ annular through a mask with a mask size of 105 nm line/262.5 nm pitch. After PEB (125° C. for 60 seconds) on a hot plate of a "CLEAN TRACK ACT8" and cooling (23° C., 30 seconds), the exposed resist was developed by paddle development (30 seconds) using a developing cup LD nozzle and 2.38 mass % TMAH aqueous solution, and washed with ultra pure water. An evaluation substrate A on which a first resist pattern was formed was obtained by centrifugation at 2000 rpm for 15 seconds.

(ii) The first resist pattern of the resulting substrate A for evaluation was baked (PEB: 200° C., 90 seconds) on a "CLEAN TRACK ACT8" hot plate to obtain an evaluation substrate B on which an insolubilized resist pattern was formed.

(iii) The second resist agent ("CLEAN TRACK ACT8") was spin coated on the insolubilized resist pattern of the evaluation substrate B obtained in (ii) above, the coating was baked (PB, 100° C., 60 seconds) and cooled (23° C., 30 seconds) to obtain a coated film with a thickness of 120 nm. The space area of the insolubilized resist pattern was exposed to radiation using an ArF exposure apparatus ("S306C" manufactured by NIKON) under the optical conditions of NA: 0.78 and outer/inner=2/3 annular through a mask with a mask size of 130 nm line/260 nm pitch. After PEB (110° C. for 60 seconds) on a hot plate of a "CLEAN TRACK ACTS" and cooling (23° C., 30 seconds), the exposed resist was developed by paddle development (30 seconds) using a developing cup LD nozzle and 2.38 mass % TMAH aqueous solution, and washed with ultra pure water. An evaluation substrate C on which a second resist pattern was formed was obtained by centrifugal drying at 2000 rpm for 15 seconds.

The results after the steps (i) and (ii) were evaluated as "Bad" if the first resist pattern was lost or unresolved and as "Good" if DP was formed and resolved without top loss scum. The step conditions and results are shown in Table 2. As a Comparative Example, B-2 (100 parts by mass) was used as a polymer.

TABLE 2

| | Step (i) | | Step (ii) | Step (iii) | | |
|---|---|---|---|---|---|---|
| | Bake (temp/time) (° C./s) | PEB (temp/time) (° C./s) | PEB (temp/time) (° C./s) | Bake (temp/time) (° C./s) | PEB (temp/time) (° C./s) | DP pattern |
| Example 2 | 130/60 | 125/60 | 200/90 | 100/60 | 110/60 | Good |
| Example 3 | 130/60 | 125/60 | 200/90 | 100/60 | 110/60 | Good |
| Example 4 | 130/60 | 125/60 | 200/90 | 100/60 | 110/60 | Good |
| Example 5 | 130/60 | 125/60 | 200/90 | 100/60 | 110/60 | Good |
| Example 6 | 130/60 | 125/60 | 200/90 | 100/60 | 110/60 | Good |
| Example 7 | 130/60 | 125/60 | 200/90 | 100/60 | 110/60 | Good |
| Example 8 | 130/60 | 125/60 | 200/90 | 100/60 | 110/60 | Good |
| Example 9 | 130/60 | 125/60 | 200/90 | 100/60 | 110/60 | Good |
| Example 10 | 130/60 | 125/60 | 200/90 | 100/60 | 110/60 | Good |
| Example 11 | 130/60 | 125/60 | 200/90 | 100/60 | 110/60 | Good |
| Example 12 | 130/60 | 125/60 | 200/90 | 100/60 | 110/60 | Good |
| Example 13 | 130/60 | 125/60 | 200/90 | 100/60 | 110/60 | Good |
| Comparative Example 1 | 130/60 | 125/60 | 200/90 | 100/60 | 110/60 | Bad |

The embodiments of the present invention relates to a method for forming a resist pattern using a positive-working radiation-sensitive resin composition suitably used in liquid immersion lithography in which a resist film is exposed to radiation through a liquid for liquid immersion lithography such as water.

Since a good pattern surpassing a wavelength limit can be economically formed according to the resist pattern forming method in which the positive-working radiation-sensitive resin composition of the embodiment of the present invention is used, the method of the embodiment of the present invention can be used very suitably in the field of microfabrication represented by production of integrated circuit elements which are expected to become increasingly micronized in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for forming a pattern comprising:
providing a first positive-working radiation-sensitive resin composition on a substrate to form a first resist layer, the first positive-working radiation-sensitive resin composition comprising:
a crosslinking agent;
a polymer containing an acid-unstable group and not containing a crosslinking group;
a radiation-sensitive acid generator; and
a solvent;
exposing the first resist layer selectively to radiation through a first mask;
developing the exposed first resist layer to form a first resist pattern;
making the first resist pattern inactive to radiation, or insolubilizing the first resist pattern in an alkaline developer or in a second positive-working radiation-sensitive resin composition;
providing the second positive-working radiation-sensitive resin composition on the substrate on which the first resist pattern has been formed to form a second resist layer;
exposing the second resist layer selectively in a space area of the first resist pattern to radiation through a second mask; and
developing the exposed second resist layer to form a second resist pattern in the space area of the first resist pattern,
wherein the crosslinking agent is a compound having two or more groups shown by a following formula (1), a compound having two or more epoxy groups or oxetane groups, or a compound having two or more vinyl groups and a skeleton shown by any one of following formulas (12-1) to (12-4),

(1)

wherein $R^1$ and $R^2$ each independently represent a hydrogen atom or a group shown by a following formula (2), at least one of $R^1$ and $R^2$ being a group shown by the following formula (2),

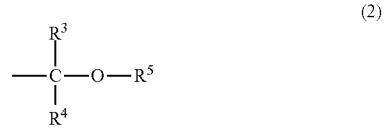

(2)

wherein $R^3$ and $R^4$ each independently represent a hydrogen atom, an alkyl group having 1 to 6 carbon atoms, or an alkoxyalkyl group having 1 to 6 carbon atoms, or $R^3$ and $R^4$ taken together represent a ring having 2 to 10 carbon atoms, and $R^5$ represents a hydrogen atom or an alkyl group having 1 to 6 carbon atoms,

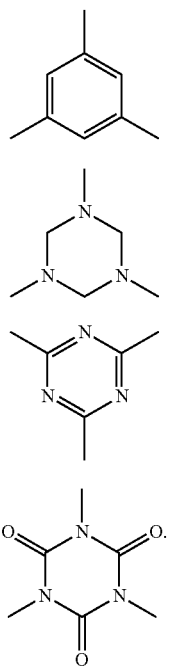

(12-1)

(12-2)

(12-3)

(12-4)

2. A method for forming a pattern comprising:
providing a first positive-working radiation-sensitive resin composition on a substrate to form a first resist layer, the first positive-working radiation-sensitive resin composition comprising:
 a polymer containing a crosslinking group and an acid-unstable group;
 a radiation-sensitive acid generator; and
 a solvent;
exposing the first resist layer selectively to radiation through a first mask;
developing the exposed first resist layer to form a first resist pattern;
making the first resist pattern inactive to radiation, or insolubilizing the first resist pattern in an alkaline developer or in a second positive-working radiation-sensitive resin composition;
providing the second positive-working radiation-sensitive resin composition on the substrate on which the first resist pattern has been formed to form a second resist layer;
exposing the second resist layer selectively in a space area of the first resist pattern to radiation through a second mask; and
developing the exposed second resist layer to form a second resist pattern in the space area of the first resist pattern, wherein the polymer includes at least one repeating unit which has the crosslinking group and which is derived from a monomer shown by following formulas (5-1) or (5-2),

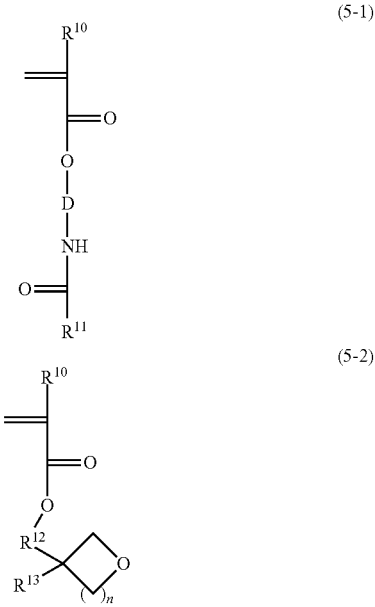

(5-1)

(5-2)

wherein, $R^{10}$ represents a hydrogen atom, a methyl group, or a trifluoromethyl group, D represents a methylene group, an ethylene group, or a propylene group; and $R^{11}$ is a group shown by a following formula (5-1-A) or a following formula (5-1-B), $R^{12}$ represents a methylene group or an alkylene group having 2 to 6 carbon atoms, $R^{13}$ represents a hydrogen atom, a methyl group, or an ethyl group, and n is 0 or 1,

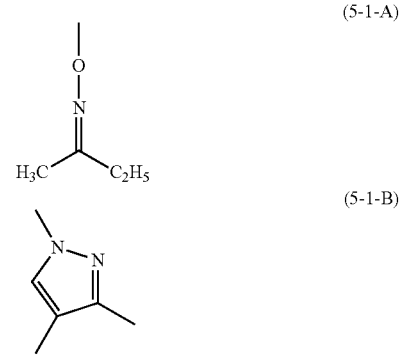

(5-1-A)

(5-1-B)

3. The method according to claim 1, wherein the first resist pattern is made inactive by being heated at a 140° C. or higher temperature, or by being exposed to radiation at a wavelength of not more than 300 nm.

4. The method according to claim 2, wherein the first resist pattern is made inactive by being heated at a 140° C. or higher temperature, or by being exposed to radiation at a wavelength of not more than 300 nm.

* * * * *